(12) United States Patent
Wu

(10) Patent No.: US 11,094,632 B2
(45) Date of Patent: Aug. 17, 2021

(54) SEMICONDUCTOR DEVICE WITH AIR GAP AND METHOD FOR PREPARING THE SAME

(71) Applicant: NANYA TECHNOLOGY CORPORATION, New Taipei (TW)

(72) Inventor: Chih-Tsung Wu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/585,414

(22) Filed: Sep. 27, 2019

(65) Prior Publication Data

US 2021/0098389 A1  Apr. 1, 2021

(51) Int. Cl.
| | | |
|---|---|---|
| *H01L 23/532* | (2006.01) | |
| *H01L 21/02* | (2006.01) | |
| *H01L 21/768* | (2006.01) | |
| *H01L 27/108* | (2006.01) | |
| *H01L 23/528* | (2006.01) | |
| *H01L 21/311* | (2006.01) | |
| *H01L 21/321* | (2006.01) | |

(52) U.S. Cl.
CPC .. *H01L 23/53295* (2013.01); *H01L 21/02164* (2013.01); *H01L 21/31116* (2013.01); *H01L 21/7682* (2013.01); *H01L 21/76802* (2013.01); *H01L 21/76837* (2013.01); *H01L 21/76877* (2013.01); *H01L 23/528* (2013.01); *H01L 27/10814* (2013.01); *H01L 27/10885* (2013.01); *H01L 21/3212* (2013.01); *H01L 21/7684* (2013.01); *H01L 27/10823* (2013.01); *H01L 27/10888* (2013.01); *H01L 27/10891* (2013.01)

(58) Field of Classification Search
CPC .......... H01L 21/7682; H01L 21/76802; H01L 27/10888; H01L 23/528; H01L 21/02164; H01L 21/76877; H01L 23/53295; H01L 27/10814; H01L 21/31116; H01L 21/76837; H01L 27/10885; H01L 27/10891; H01L 27/10823; H01L 21/7684; H01L 21/3212

See application file for complete search history.

(56) References Cited

U.S. PATENT DOCUMENTS

| | | | |
|---|---|---|---|
| 10,043,809 B1 * | 8/2018 | Chang | ............... H01L 27/10894 |
| 2013/0320550 A1 * | 12/2013 | Kim | .................. H01L 21/76897 |
| | | | 257/773 |
| 2016/0049409 A1 | 2/2016 | Yeom et al. | |

\* cited by examiner

*Primary Examiner* — Jasmine J Clark
(74) *Attorney, Agent, or Firm* — Muncy, Geissler, Olds & Lowe, P.C.

(57) ABSTRACT

The present disclosure provides a semiconductor device and a method for preparing the semiconductor device. The semiconductor device includes a plurality of spacer bit lines disposed over a substrate; a plurality of dielectric pillars disposed over the substrate, between the plurality of spacer bit lines; and a sealing dielectric layer disposed over the plurality of spacer bit lines and the plurality of dielectric pillars such that air gaps are formed between the sealing dielectric layer and the substrate.

20 Claims, 20 Drawing Sheets

SEMICONDUCTOR DEVICE WITH AIR GAP AND METHOD FOR PREPARING THE SAME

TECHNICAL FIELD

The present disclosure relates to a semiconductor device and a method for preparing the same, and more particularly, to a semiconductor device with air gaps between conductive lines (e.g., bit lines) and a method for preparing the same.

DISCUSSION OF THE BACKGROUND

Due to structural simplicity, dynamic random access memories (DRAMs) can provide more memory cells per unit chip area than other types of memories, such as static random access memories (SRAMs). A DRAM is comprised of a plurality of DRAM cells, each of which includes a capacitor for storing information and a transistor coupled to the capacitor for regulating when the capacitor is charged or discharged. During a read operation, a word line (WL) is asserted, turning on the transistor. The enabled transistor allows the voltage across the capacitor to be read by a sense amplifier through a bit line (BL). During a write operation, the data to be written is provided on the BL while the WL is asserted.

To satisfy the demand for greater memory storage, the dimensions of the DRAM memory cells have been continuously reduced so that the packing densities of such DRAMs have increased considerably. However, as DRAM memory cell dimension requirements are dictating decreased sizes, capacitive coupling, which results in increased parasitic capacitance, is becoming an increasingly important issue. Accordingly, the speeds of DRAM memory cells are undesirably reduced and the overall device performance is being negatively impacted.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a plurality of spacer bit lines disposed over a substrate; a plurality of dielectric pillars disposed over the substrate, between the plurality of spacer bit lines; and a sealing dielectric layer disposed over the plurality of spacer bit lines and the plurality of dielectric pillars such that air gaps are formed between the sealing dielectric layer and the substrate.

In one embodiment of the present disclosure, a top width of the dielectric pillar is greater than a bottom width of the dielectric pillar.

In one embodiment of the present disclosure, a top surface of the first bit line is higher than a top surface of the air gap.

In one embodiment of the present disclosure, a bottom width of the dielectric pillar at one side of the spacer bit lines is different from a bottom width at another side of the spacer bit lines.

In one embodiment of the present disclosure, a top end of the dielectric pillars is lower than a top end of the spacer bit lines.

In one embodiment of the present disclosure, a top portion of the spacer bit line has a rounded corner In one embodiment of the present disclosure, a portion of the air gap extends between the sealing dielectric layer and the rounded corner of the spacer bit line.

In one embodiment of the present disclosure, the air gap has a tapered profile.

In one embodiment of the present disclosure, an upper width of the air gap is to less than a bottom width of the air gap.

In one embodiment of the present disclosure, a method for preparing a semiconductor device is provided. The method includes forming a plurality of dielectric structures over a substrate; forming a plurality of spacer bit lines on sidewalls of the plurality of dielectric structures; removing the plurality of dielectric structures from the substrate; forming a plurality of temporary spacers on sidewalls of the spacer bit lines; forming a plurality of dielectric pillars over the substrate, between the plurality of temporary spacers; removing the plurality of temporary spacers from the substrate; and forming a sealing dielectric layer over the plurality of spacer bit lines and the plurality of dielectric pillars such that air gaps are formed between the sealing dielectric layer and the substrate.

In one embodiment of the present disclosure, a top surface of the semiconductor substrate between the spacer bit lines is exposed after forming the plurality of spacer bit lines.

In one embodiment of the present disclosure, the spacer bit lines are in direct contact with the dielectric structures.

In one embodiment of the present disclosure, the bit lines are separated by the air gaps and the dielectric pillars.

In one embodiment of the present disclosure, a top width of the dielectric pillar is greater than a bottom width of the dielectric pillar.

In one embodiment of the present disclosure, a top surface of the first bit line is higher than a top surface of the air gap.

In one embodiment of the present disclosure, a bottom width of the dielectric pillar at one side of the spacer bit lines is different from a bottom width at another side of the spacer bit lines.

In one embodiment of the present disclosure, a top end of the dielectric pillars is lower than a top end of the spacer bit lines.

In one embodiment of the present disclosure, a top portion of the spacer bit line has a rounded corner In one embodiment of the present disclosure, a portion of the air gap extends between the sealing dielectric layer and the rounded corner of the spacer bit line.

In one embodiment of the present disclosure, the air gap has a tapered profile, and an upper width of the air gap is less than a bottom width of the air gap.

Embodiments of a semiconductor device are provided in accordance with some embodiments of the disclosure. The semiconductor device includes spacers bit lines separated by dielectric pillars and air gaps. Therefore, the parasitic capacitance between the spacers bit lines may be reduced by the dielectric pillars and the air gap having low dielectric constant, and the speeds of the semiconductor device may be increased. In addition, the spacers bit lines may be prevented from collapsing due to the structural support provided by the dielectric structure, resulting in an improvement of the overall device performance.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
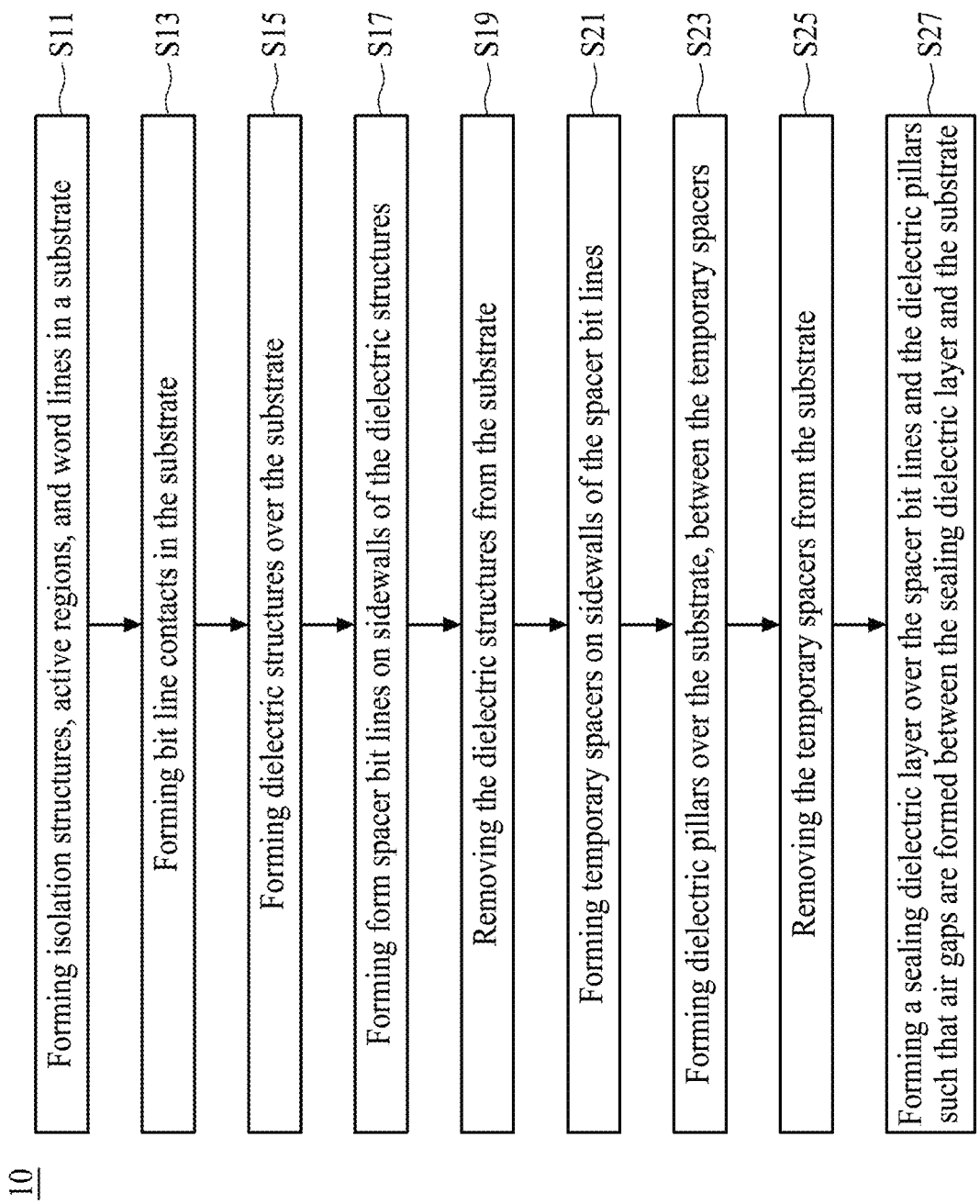
FIG. 1 is a flow diagram illustrating a method of preparing a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow diagram illustrating a method 10 of forming the semiconductor device 100 in accordance with some embodiments, and the method 10 includes steps: S11, forming isolation structures, active regions, and word lines in a substrate; S13, forming bit line contacts in the substrate; S15, forming dielectric structures over the substrate; S17, forming spacer bit lines on sidewalls of the dielectric structures; S19, removing the dielectric structures from the substrate; S21, forming temporary spacers on sidewalls of the spacer bit lines; S23, forming dielectric pillars over the substrate, between the temporary spacers; S25, removing the temporary spacers; and S27, forming a sealing dielectric layer over the spacer bit lines and the dielectric pillars such that air gaps are formed between the sealing dielectric layer and the substrate in accordance with some embodiments. The steps S11 to S27 of FIG. 3 are elaborated in connection with FIGS. 1 and 2 to 20.

Figure 2:
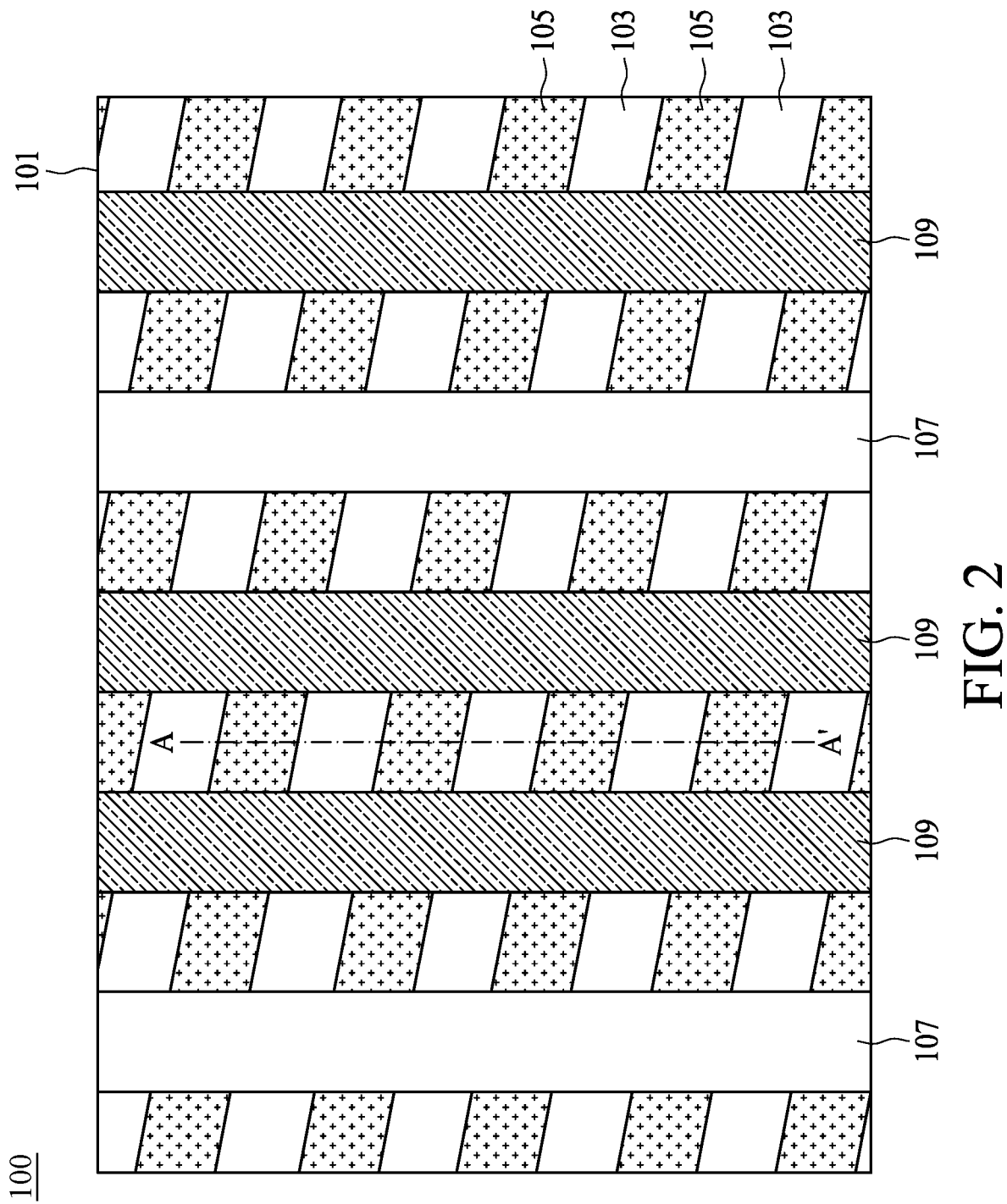
FIG. 2 is a top view illustrating one of the intermediate stages in the formation of a semiconductor device, in accordance with some embodiments.
Figure 3:
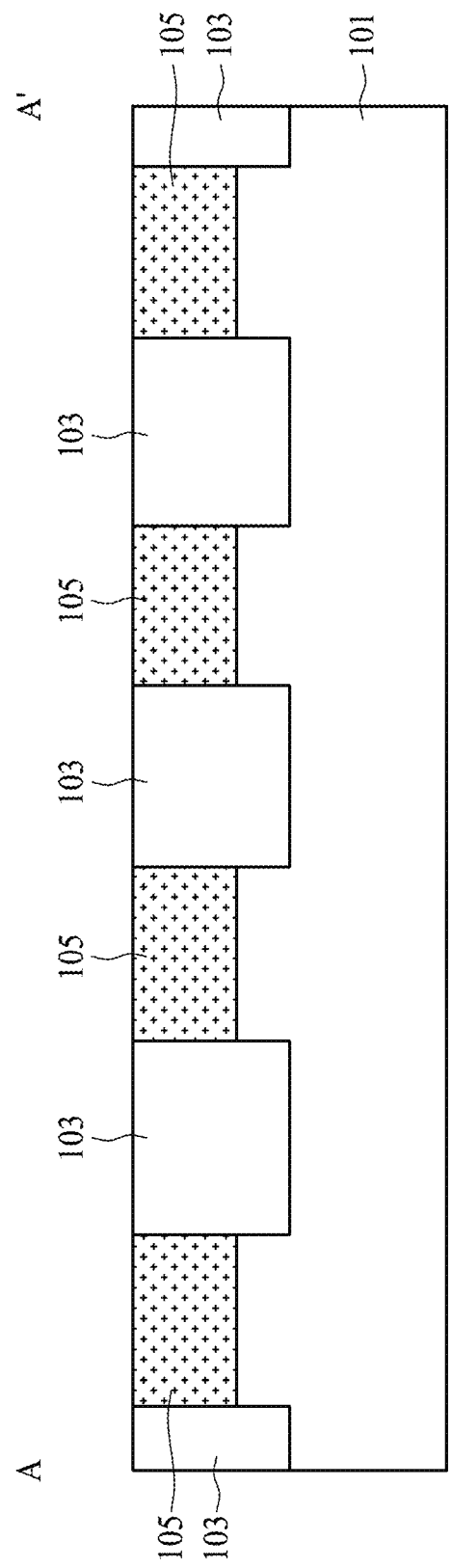
FIG. 3 is a cross-sectional view illustrating one of the intermediate stages in the formation of the semiconductor device along the sectional line A-A' in FIG. 2, in accordance with some embodiments.

FIG. 2 is a top view illustrating one of the intermediate stages in the formation of the semiconductor device 100, and FIG. 3 is a cross-sectional view illustrating one of the intermediate stages in the formation of the semiconductor device 100 along the sectional line A-A' in FIG. 2, in accordance with some embodiments.

As shown in FIGS. 2 and 3, the semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and diamond. Examples of the compound semiconductor materials may include, but are not limited to, silicon carbide, gallium arsenic, gallium phosphide, indium phosphide, indium arsenide, and indium antimonide. Examples of the alloy semiconductor materials may include, but are not limited to, SiGe, GaAsP, AlInAs, AlGaAs, GaInAs, GaInP, and GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

Still referring to FIGS. 2 and 3, the isolation structures 103 are formed in the semiconductor substrate 101, and the isolation structures 103 are shallow trench isolation (STI) structures, in accordance with some embodiments. In some other embodiments, the isolation structures 103 are local oxidation of silicon (LOCOS) structures (not shown). In such cases, portions of the isolation structures 103 are embedded in the semiconductor substrate 101, and other portions of the isolation structures 103 protrude from the top surface of the semiconductor substrate 101. In addition, the isolation structures 103 may be made of silicon oxide, silicon nitride, silicon oxynitride or another applicable dielectric material.

Moreover, the isolation structures 103 define the active regions 105 in the semiconductor substrate 101, and the active regions 105 include S/D regions. In some embodiments, the S/D regions of the active regions 105 are formed by one or more ion implantation processes, and P-type dopants, such as boron (B) or BF2, or N-type dopants, such as phosphorous (P) or arsenic (As), can be implanted in the active regions 105 to form the S/D regions.

Referring to the step S11 in FIG. 1, the method 10 forms isolation structures, active regions, and word lines in a substrate. In some embodiments, the word lines 109 and the isolation lines 107 are formed in the semiconductor substrate 101, as shown in FIGS. 2 and 3 in accordance with some embodiments. In some embodiments, each of the word lines 109 includes a buried gate electrode (not shown). In some embodiments, each of the word lines 109 also includes a gate dielectric layer (not shown) between the buried gate electrode and the semiconductor substrate 101.

In some embodiments, the buried gate electrodes are made of a conductive material such as aluminum (Al), copper (Cu), tungsten (W), titanium (Ti), tantalum (Ta), or another applicable material, and the gate dielectric layers are made of silicon oxide, silicon nitride, silicon oxynitride, a dielectric material with high dielectric constant (high-k), or a combination thereof.

In addition, the isolation lines 107 may be used for isolating groups of transistors belonging to the same active region 105 from each other, and the isolation lines 107 may be arranged parallel to the word lines 109. In some embodiments, the isolation lines 107 are made of silicon oxide, silicon nitride, silicon oxynitride, a combination thereof, or another applicable material. Moreover, each of the isolation lines 107 may include a single layer or multiple layers.

In some embodiments, the word lines 109 are formed by etching and deposition processes. First, trenches are formed in the semiconductor substrate 101 by an etching process. The etching process may include a dry etching process or a wet etching process. After the trenches are formed, one or more deposition processes may be performed to form the word lines 109 in the trenches, and the deposition process may include a chemical vapor deposition (CVD) process, a physical vapor deposition (PVD) process, a spin coating process, or another applicable process.

After performing the deposition process(es), a planarization process, such as chemical mechanical polishing (CMP), may be performed such that the top surfaces of the word lines 109 are coplanar with the top surface of the semiconductor substrate 101. Some processes used to form the isolation lines 107 are similar to, or the same as, the processes used for forming the word lines 109, and descriptions thereof are not repeated herein. In some embodiments, the word lines 109 and the isolation lines 107 are independently formed. For example, in some embodiments, the isolation lines 107 are formed before the word lines 109.

Figure 4:
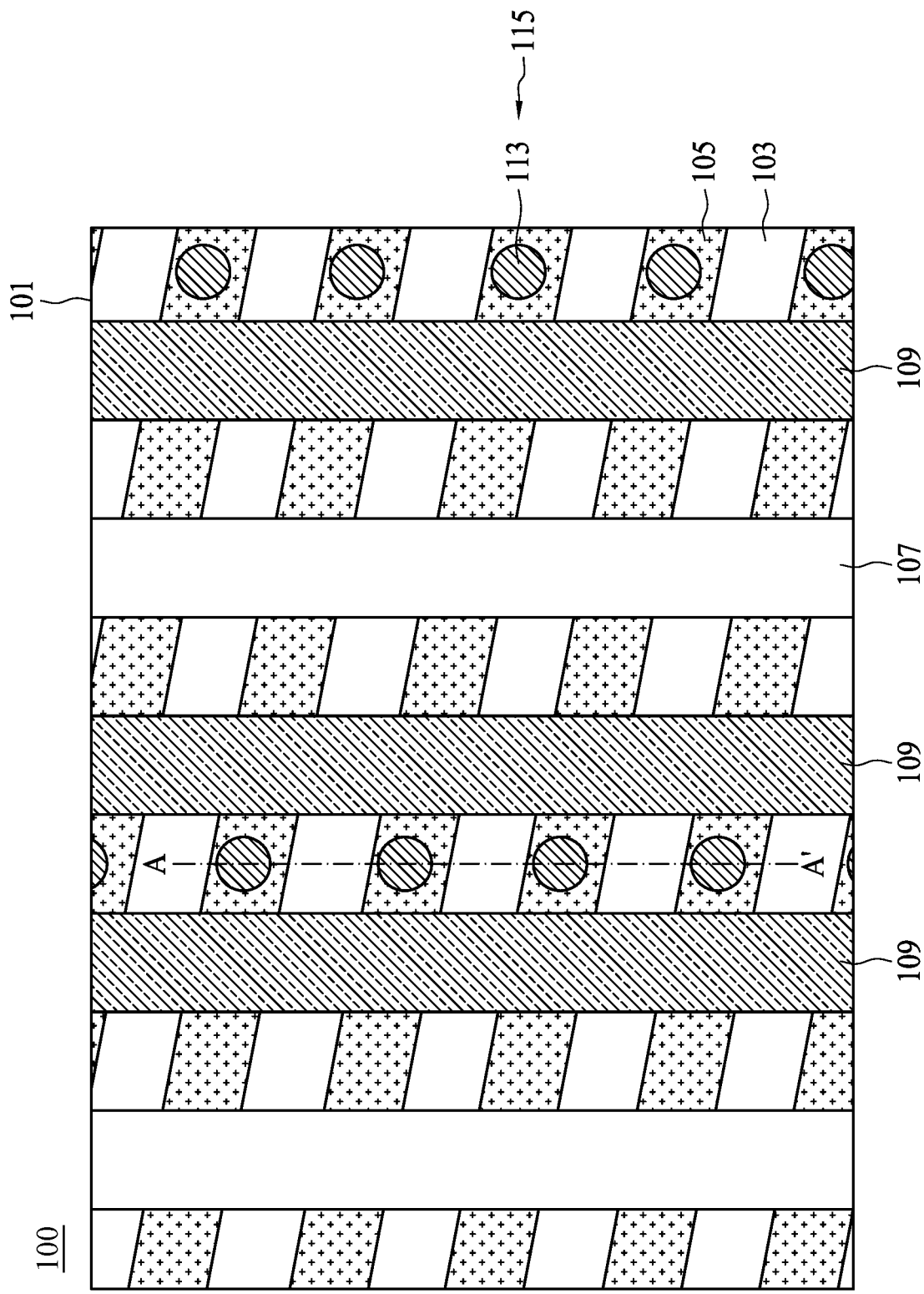
FIG. 4 is a top view illustrating one of the intermediate stages in the formation of a semiconductor device, in accordance with some embodiments.
Figure 5:
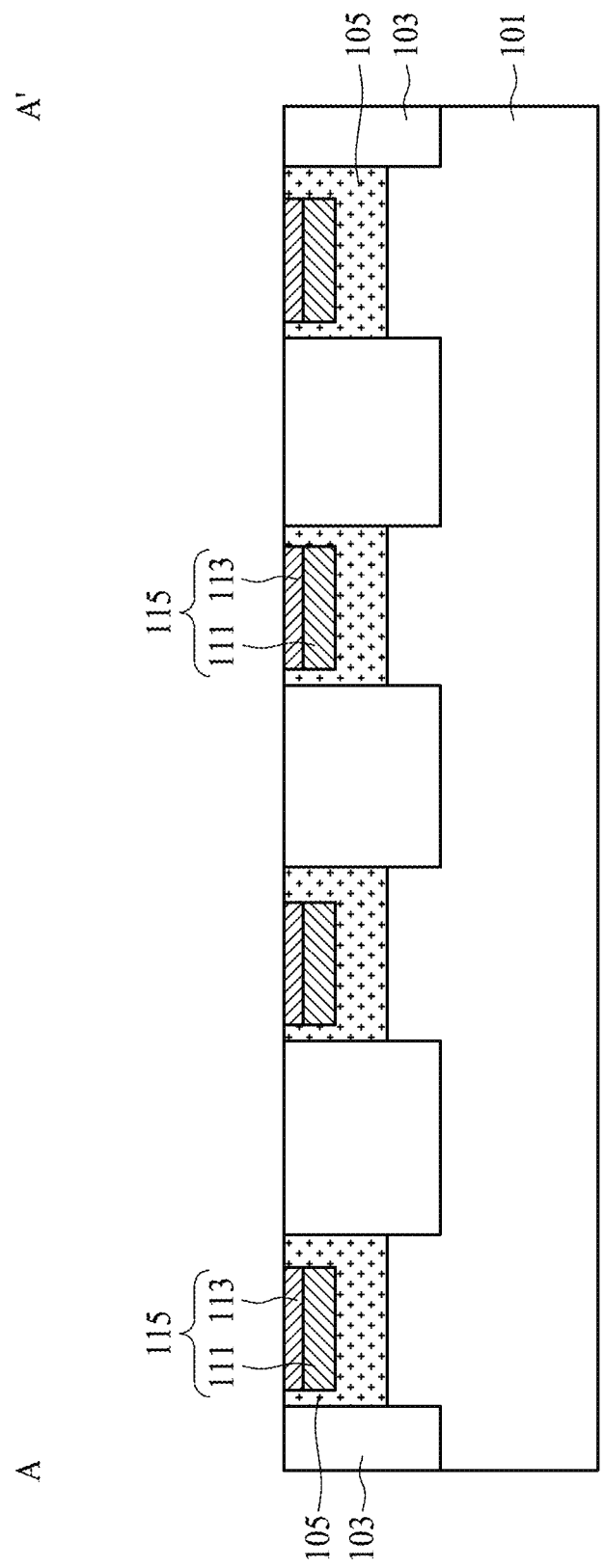
FIG. 5 is a cross-sectional view illustrating one of the intermediate stages in the formation of the semiconductor device along the sectional line A-A' in FIG. 4, in accordance with some embodiments.

FIG. 4 is a top view illustrating one of the intermediate stages in the formation of the semiconductor device 100, and FIG. 5 is a cross-sectional view illustrating one of the intermediate stages in the formation of the semiconductor device 100 along the sectional line A-A' in FIG. 4, in accordance with some embodiments.

Figure 7:
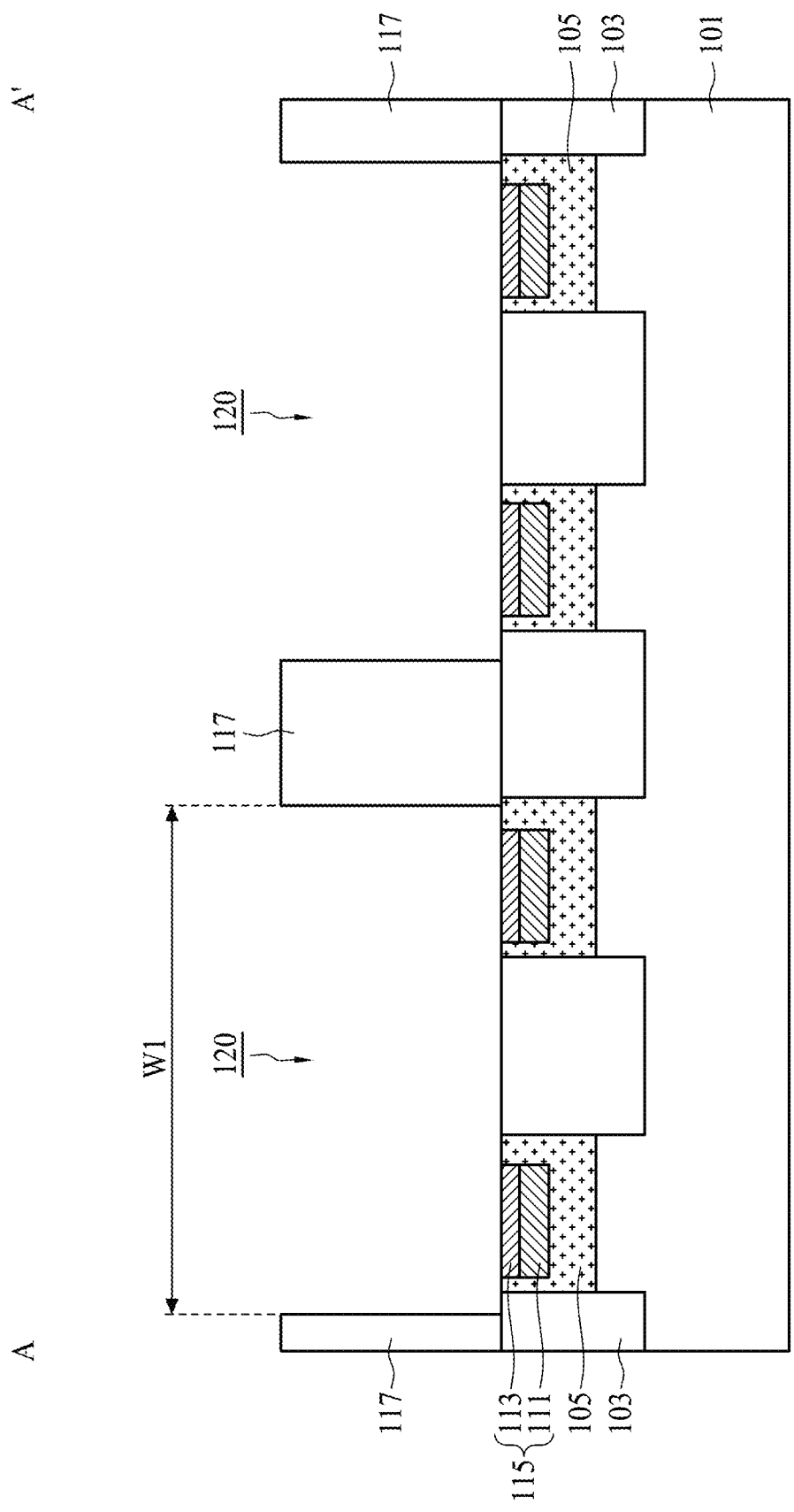
FIG. 7 is a cross-sectional view illustrating one of the intermediate stages in the formation of the semiconductor device along the sectional line A-A' in FIG. 7, in accordance with some embodiments.

Referring to the step S13 in FIG. 1, the method 10 forms bit line contacts in the substrate. In some embodiments, after the word lines 109 are formed, the bit line contacts 115 are formed in the semiconductor substrate 101, as shown in FIGS. 4 and 7 in accordance with some embodiments. In some embodiments, the bit line contacts 115 are formed in the S/D regions of the active regions 105.

In some embodiments, each of the bit line contacts 115 includes a conductive layer 111 and a metal silicide layer 113 over the conductive layer 111. In some embodiments, the conductive layers 111 are made of poly-crystalline silicon, tungsten (W), aluminum (Al), copper (Cu), nickel (Ni), cobalt (Co), another conductive material, or a combination thereof, and the metal silicide layers 113 are made of cobalt silicide, titanium silicide, tantalum silicide, nickel silicide, copper silicide, tungsten silicide, molybdenum silicide, another applicable metal silicide, or a combination thereof.

In some embodiments, the bit line contacts 115 are formed by etching and deposition processes. Some processes used to form the bit line contacts 115 are similar to, or the same as, the processes used for forming the word lines 109, and are not repeated herein. In some embodiments, the metal silicide layers 113 are formed by depositing a metal material (e.g., cobalt) over the conductive layers 111, and performing a thermal treatment on the metal material to form the metal silicide layers 113 (e.g., cobalt silicide) from the metal material. After the thermal treatment process is performed, a planarization process, such as chemical mechanical polishing (CMP), may be performed such that the top surfaces of the bit line contacts 115 are coplanar with the top surface of the semiconductor substrate 101.

Figure 6:
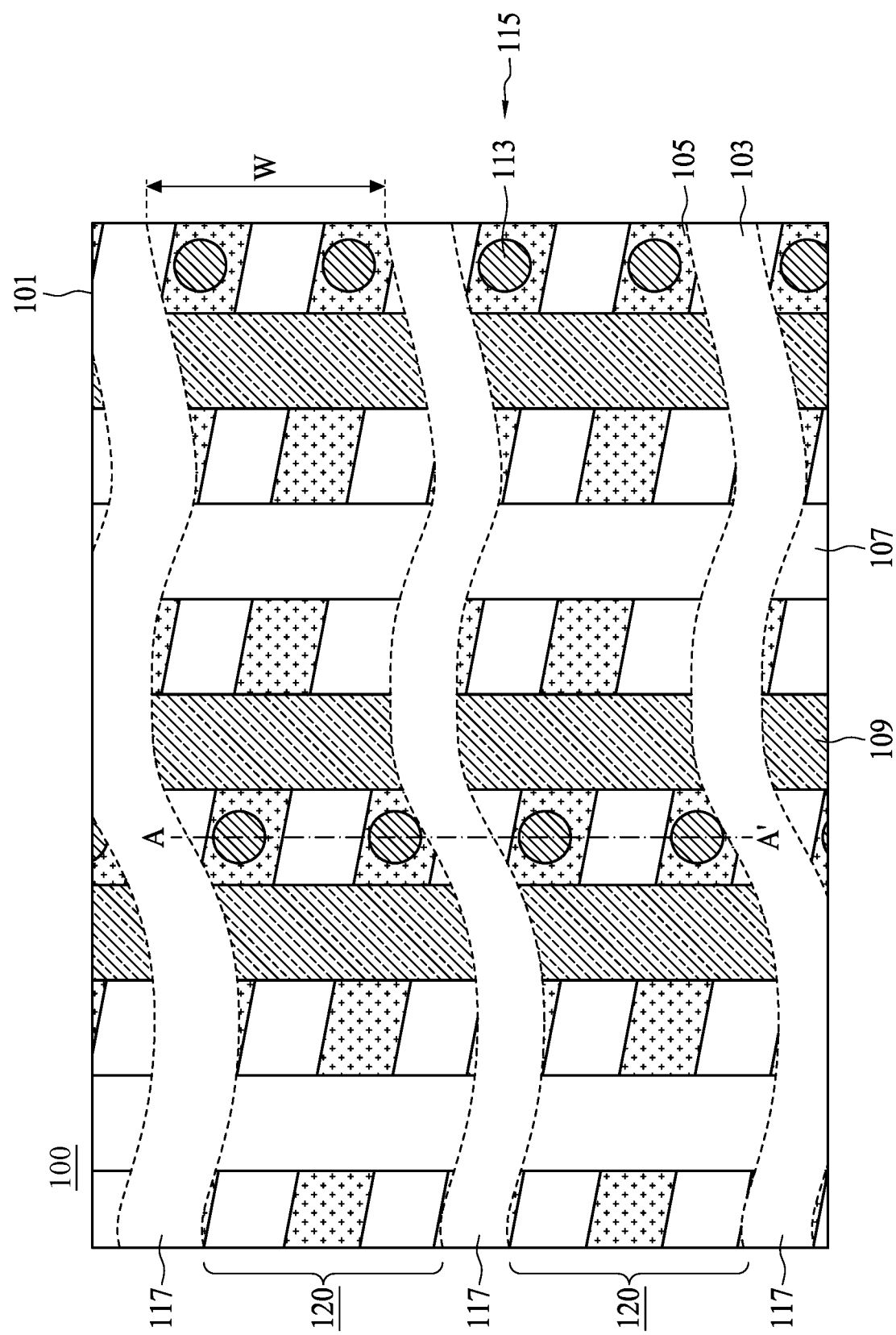
FIG. 6 is a top view illustrating one of the intermediate stages in the formation of a semiconductor device, in accordance with some embodiments.

FIG. 6 is a top view illustrating one of the intermediate stages in the formation of the semiconductor device 100, and FIG. 7 is a cross-sectional view illustrating one of the intermediate stages in the formation of the semiconductor device 100 along the sectional line A-A' in FIG. 6, in accordance with some embodiments.

Referring to the step S15 in FIG. 1, the method 10 forms dielectric structures over the substrate. In some embodiments, after the bit line contacts 115 are formed, the dielectric structures 117 are formed over the top surface of the semiconductor substrate 101, as shown in FIGS. 6 and 7 in accordance with some embodiments. In addition, the top surface of the semiconductor substrate 101 is partially exposed by a plurality of openings 120 between the dielectric structures 117.

In some embodiments, the dielectric structures 117 are made of low-k dielectric materials. In some embodiments, the low-k dielectric materials have a dielectric constant (k value) less than about 4. Examples of low-k dielectric materials include, but are not limited to, silicon oxide, silicon nitride, silicon carbonitride (SiCN), silicon oxide carbonitride (SiOCN), fluorinated silica glass (FSG), carbon doped silicon oxide, amorphous fluorinated carbon, parylene, bis-benzocyclobutenes (BCB), or polyimide.

In some other embodiments, the dielectric structures 117 are made of extreme low-k (ELK) dielectric materials with a dielectric constant less than about 2.5. In some embodiments, ELK dielectric materials include carbon doped silicon oxide, polytetrafluoroethylene (PTFE) (Teflon), silicon oxycarbide polymers (SiOC), hydrogen silsesquioxane (HSQ), methyl silsesquioxane (MSQ), polyarylether (PAE), SiLK™ (Dow Chemical, Midland, Mich.), Black Diamond™ (Applied Materials, Santa Clara, Calif.), Coral™ (Novellus System, San Jose, Calif.), xeragel, aerogel porous polymer and/or other suitable materials.

In some embodiments, the dielectric structures 117 are formed by a deposition process, a patterning process and an etching process. First, a dielectric layer (not shown) may be formed over the top surface of the semiconductor substrate 101 by the deposition process. The deposition process may include a chemical vapor deposition (CVD) process, a physical vapor deposition (PVD) process, a spin coating process, or another applicable process. Next, during the subsequent patterning process, a patterned mask (not shown) may be formed over the dielectric layer, and the dielectric layer may be etched during the subsequent etching process using the patterned mask as a mask.

As a result, the dielectric structures 117 are obtained, and each of the openings 120 is formed between two adjacent dielectric structures 117. It should be noted that each of the openings 120 has a width W1, and the widths W1 of the openings 120 are wide enough to allow at least two of the bit line contacts 115 adjacent to the same word line 109 to be exposed by one of the openings 120.

Figure 8:
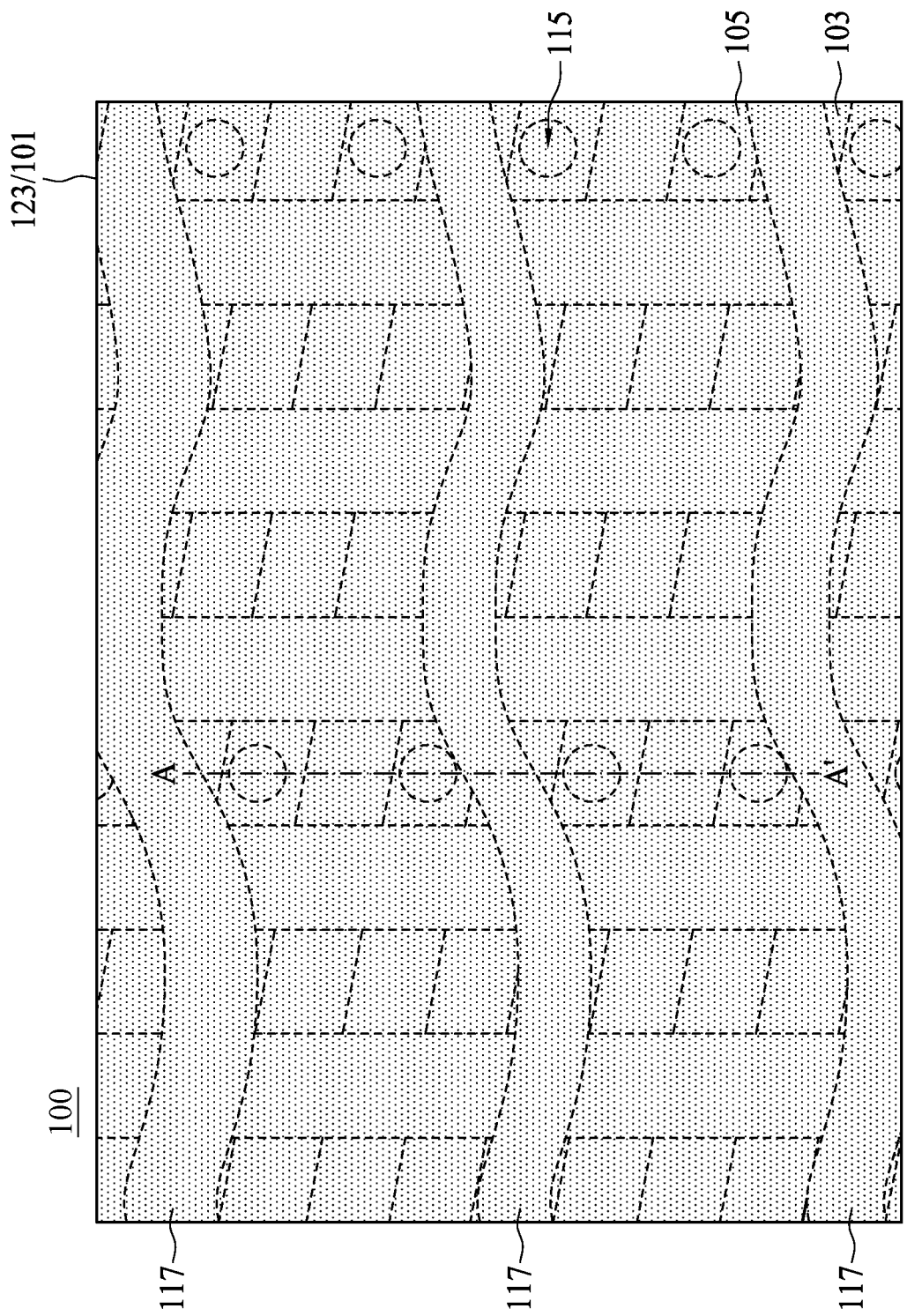
FIG. 8 is a top view illustrating one of the intermediate stages in the formation of a semiconductor device, in accordance with some embodiments.
Figure 9:
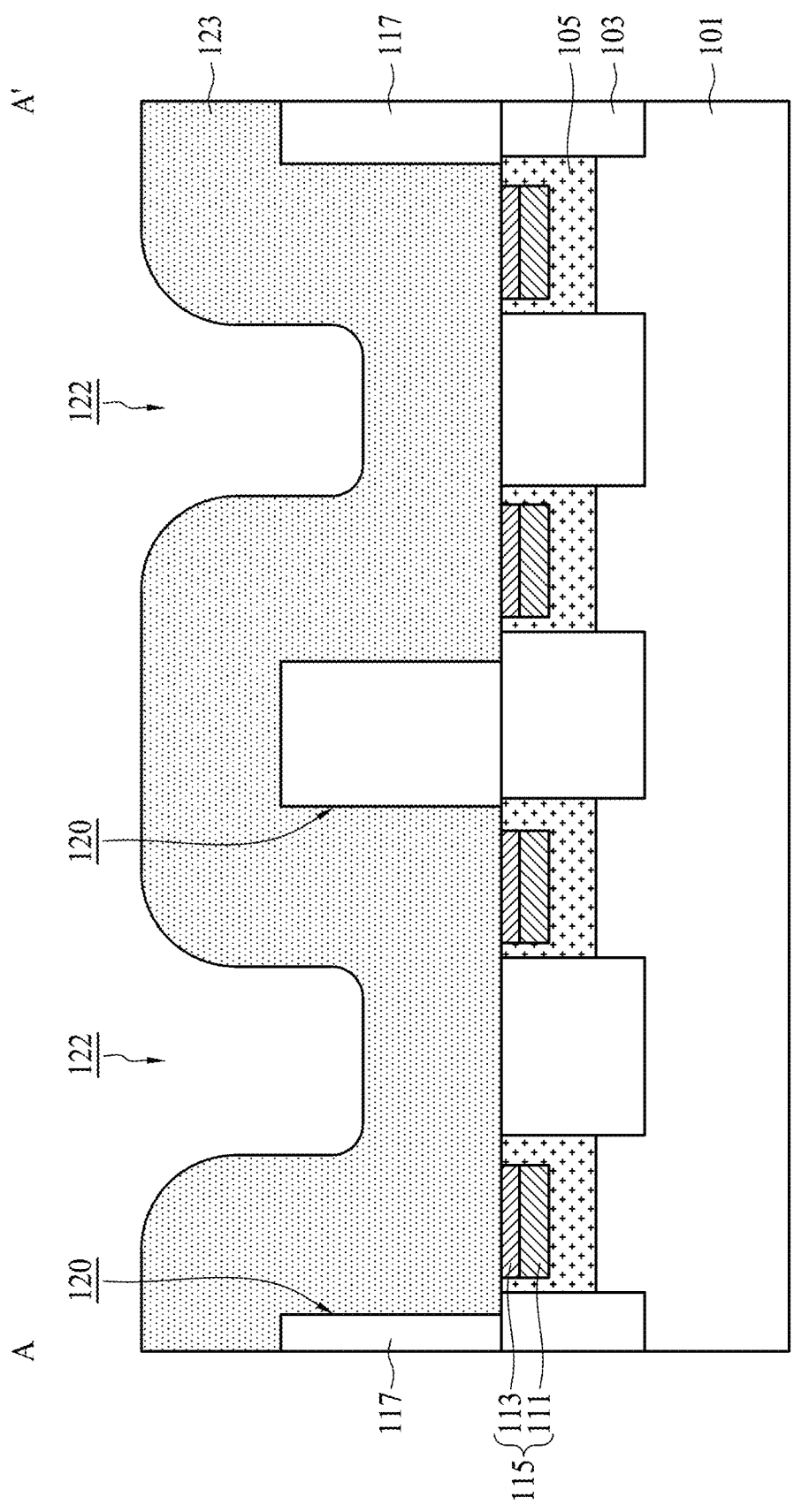
FIG. 9 is a cross-sectional view illustrating one of the intermediate stages in the formation of the semiconductor device along the sectional line A-A' in FIG. 9, in accordance with some embodiments.

FIG. 8 is a top view illustrating one of the intermediate stages in the formation of the semiconductor device 100, and FIG. 9 is a cross-sectional view illustrating one of the intermediate stages in the formation of the semiconductor device 100 along the sectional line A-A' in FIG. 8, in accordance with some embodiments.

Referring to the step S17 in FIG. 1, the method 10 forms spacer bit lines on sidewalls of the dielectric structures. In some embodiments, after the dielectric structures 117 are formed, the conductive material 123 is formed over the dielectric structures 117, and the conductive material 123 extends into the openings 120, as shown in FIGS. 8 and 9 in accordance with some embodiments. It should be noted that the portions of the top surface of the semiconductor substrate 101 exposed by the openings 120 are covered by the conductive material 123.

In some embodiments, the conductive material 123 is made of tungsten (W), aluminum (Al), copper (Cu), nickel (Ni), cobalt (Co), another conductive material, or a combination thereof. In some embodiments, the conductive material 123 is formed by a deposition process. The deposition process may include an electroplating process, a chemical vapor deposition (CVD) process, a physical vapor deposition (PVD) process, a spin coating process, an electroless plating process, or another applicable process.

In addition, since the conductive material 123 is conformally formed over the dielectric structures 117, recesses 122 are formed over and surrounded by the conductive material 123, in accordance with some embodiments. In some embodiments, the recesses 122 are formed between adjacent bit line contacts 115, and the bottom surfaces of the recesses 122 are higher than the top surface of the semiconductor substrate 101. Moreover, since the openings 120 are wide enough, the portions of the conductive material 123 filled in the openings 120 are formed without voids, thus improving the overall performance of the semiconductor device 100.

Figure 10:
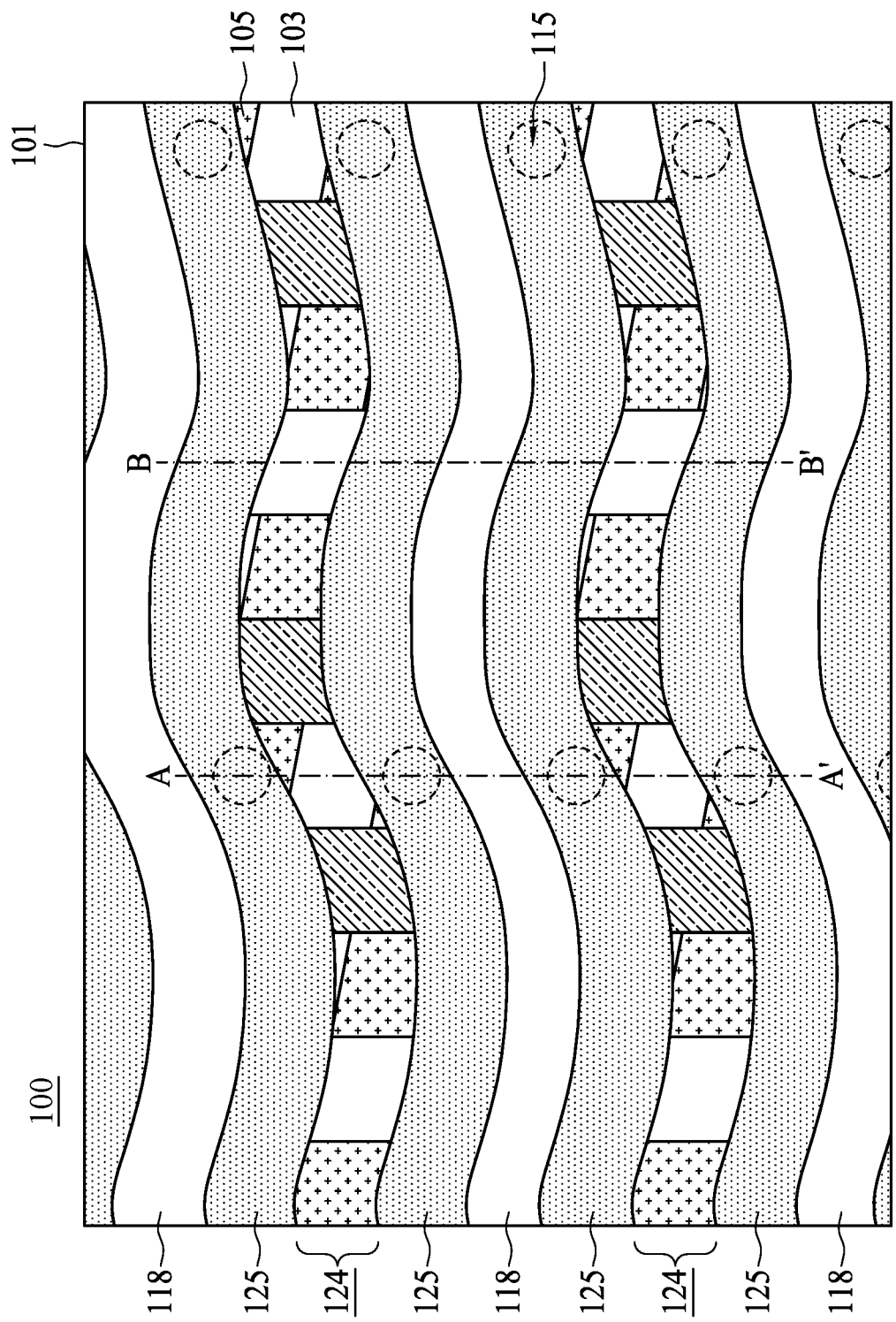
FIG. 10 is a top view illustrating one of the intermediate stages in the formation of a semiconductor device, in accordance with some embodiments.
Figure 11:
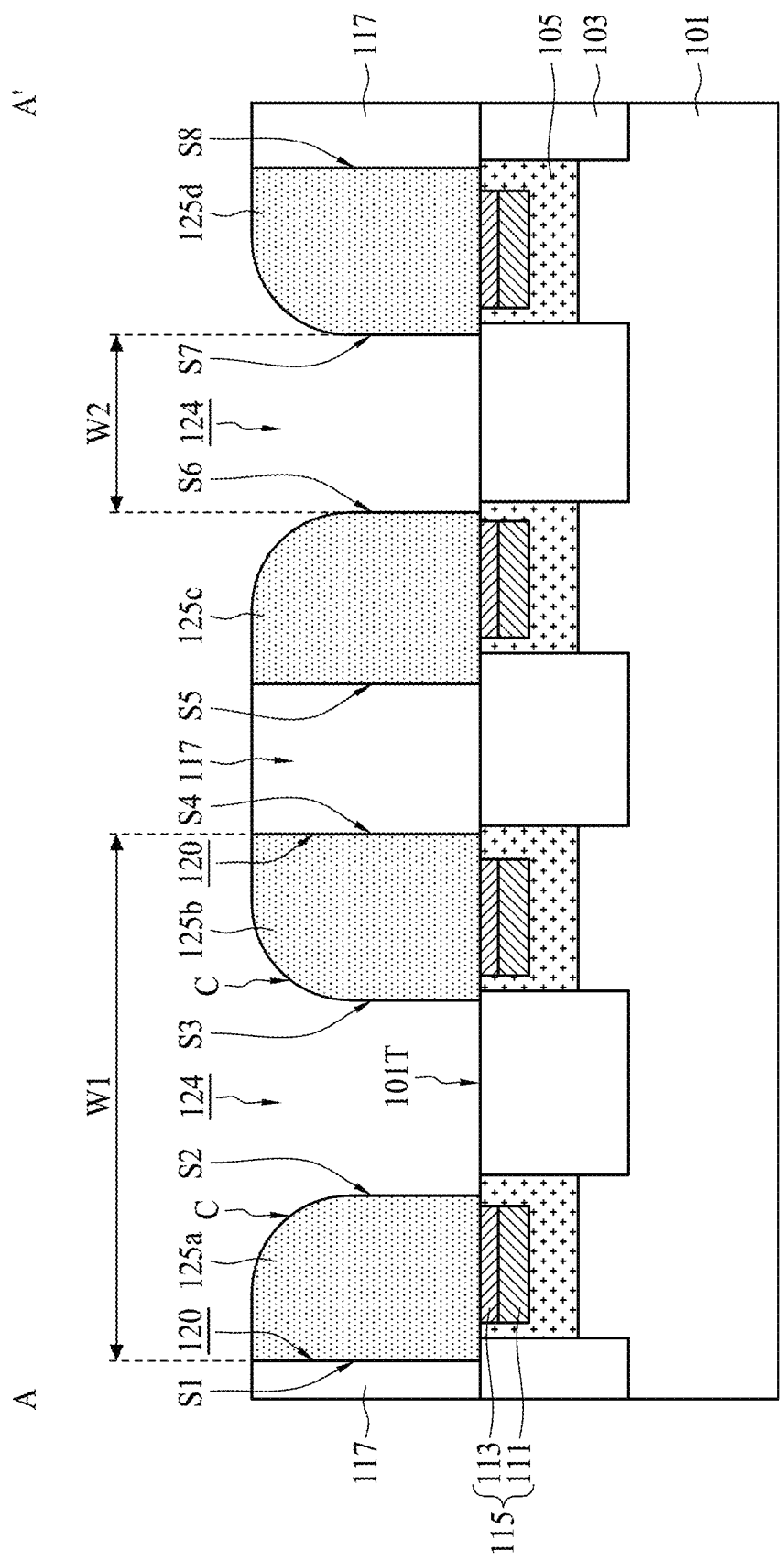
FIG. 11 is a cross-sectional view illustrating one of the intermediate stages in the formation of the semiconductor device along the sectional line A-A' in FIG. 10, in accordance with some embodiments.

FIG. 10 is a top view illustrating one of the intermediate stages in the formation of the semiconductor device 100, and FIG. 11 is a cross-sectional view illustrating one of the intermediate stages in the formation of the semiconductor device 100 along the sectional line A-A' in FIG. 10, in accordance with some embodiments.

After the conductive material 123 is formed, the conductive material 123 is partially removed to form the spacer bit lines 125a, 125b, 125c and 125d in the openings 120, the bit lines 125a and 125b are separated from each other by an opening 124, and the bit lines 125c and 125d are separated from each other by another opening 124, as shown in FIGS. 10 and 11 in accordance with some embodiments. It should be noted that each of the openings 124 has a width W2, and the width W1 of the openings 120 is greater than the width W2 of the openings 124.

In some embodiments, the conductive material 123 is partially removed by performing an etching process, and portions of the top surface 101T of the semiconductor substrate 101 are exposed by the openings 124 after the etching process is performed. In some embodiments, the etching process is an anisotropic etching process, which removes a similar amount of conductive material 123 vertically in all places, leaving the bit lines 125a, 125b, 125c and 125d along the sidewalls of the dielectric structures 117.

In some embodiments, the etching process includes a dry etching process, a wet etching process, or a combination thereof. It should be noted that the dielectric structures 117 may be used as supporters during the process for forming the bit lines 125a, 125b, 125c and 125d. Therefore, the bit lines 125a, 125b, 125c and 125d may be prevented from collapsing. This is especially critical for the bit lines 125a, 125b, 125c and 125d with high aspect ratios.

It should be noted that at least two of the bit lines 125a, 125b, 125c and 125d are formed in each opening 120, and the bit lines 125a, 125b, 125c and 125d are respectively electrically connected to the bit line contacts 115 exposed by the same opening 120 before the conductive material 123 is formed. Moreover, each of the bit lines 125a, 125b, 125c and 125d has a sidewall in direct contact with the dielectric structures 117 and an opposite sidewall exposed in the openings 124.

More specifically, the bit line 125a has a sidewall S1 and an opposite sidewall S2, the bit line 125b has a sidewall S3 and an opposite sidewall S4, the bit line 125c has a sidewall S5 and an opposite sidewall S6, and the bit line 125d has a sidewall S7 and an opposite sidewall S8. In some embodiments, the sidewalls S1, S4, S5 and S8 are in direct contact with the dielectric structures 117, and the sidewalls S2, S3, S6 and S7 are exposed in the openings 124.

In some embodiments, the top surfaces of the bit lines 125a, 125b, 125c and 125d are substantially level with the top surfaces of the dielectric structures 117. Within the context of this disclosure, the word "substantially" means preferably at least 90%, more preferably 95%, even more preferably 98%, and most preferably 99%. In some embodiments, the top portions of the bit lines 125a, 125b, 125c and 125d have rounded corners C adjacent to the openings 124.

Figure 12:
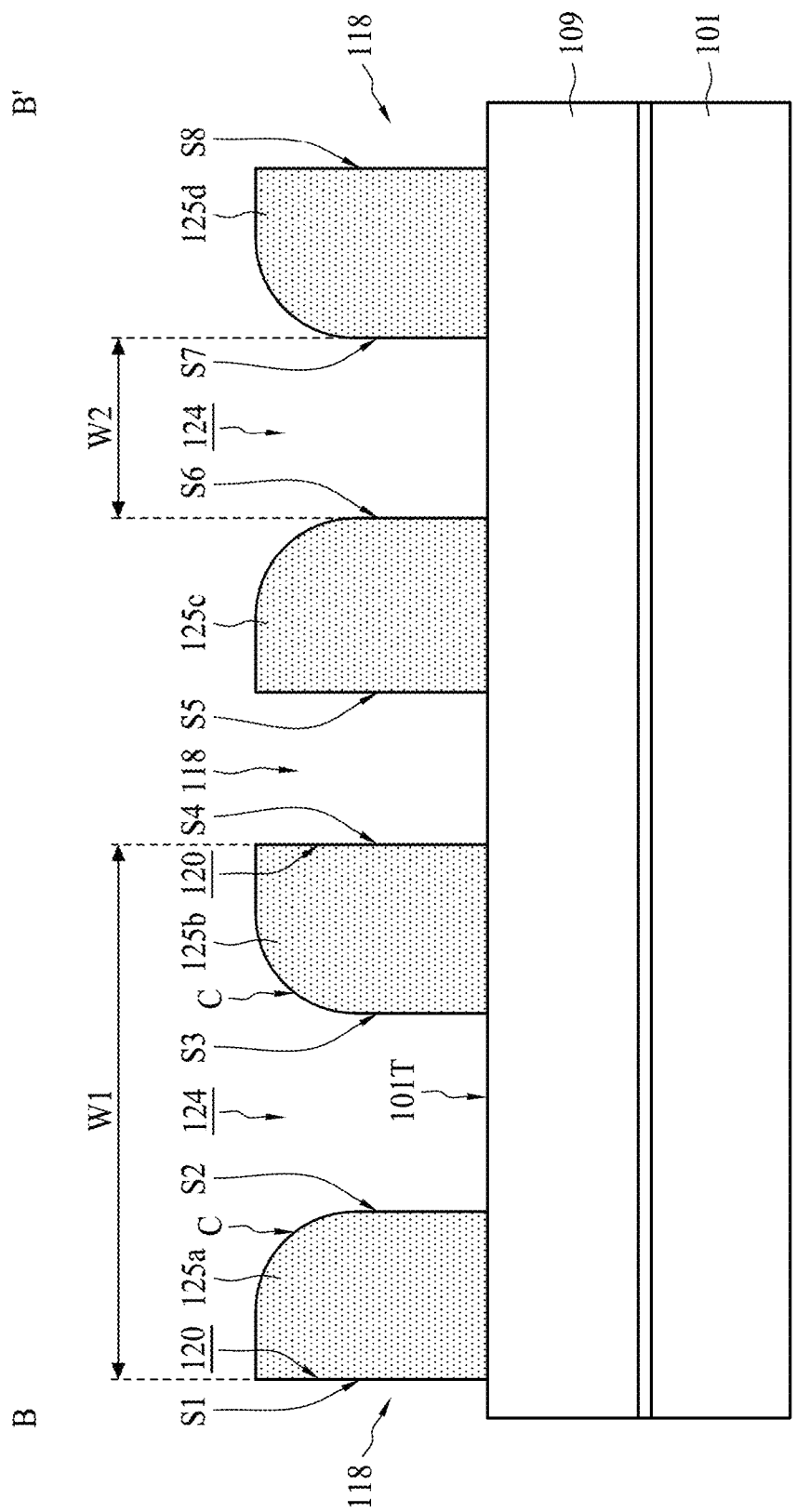
FIG. 12 is a cross-sectional view illustrating one of the intermediate stages in the formation of the semiconductor device along the sectional line B-B' in FIG. 10, in accordance with some embodiments.

FIG. 12 is a cross-sectional view illustrating one of the intermediate stages in the formation of the semiconductor device along the sectional line B-B' in FIG. 10, in accordance with some embodiments. Referring to the step S19 in FIG. 1, the method 10 removes the dielectric structures from the substrate. In some embodiments, after forming the spacer bit lines 125 in the openings 120, the dielectric structures 117 is removed from the semiconductor substrate 101 to form openings 118 between the bit lines 125. It should be noted that each of the openings 124 has a width W2, and the width W1 of the openings 120 is greater than the width W2 of the openings 118.

Figure 13:
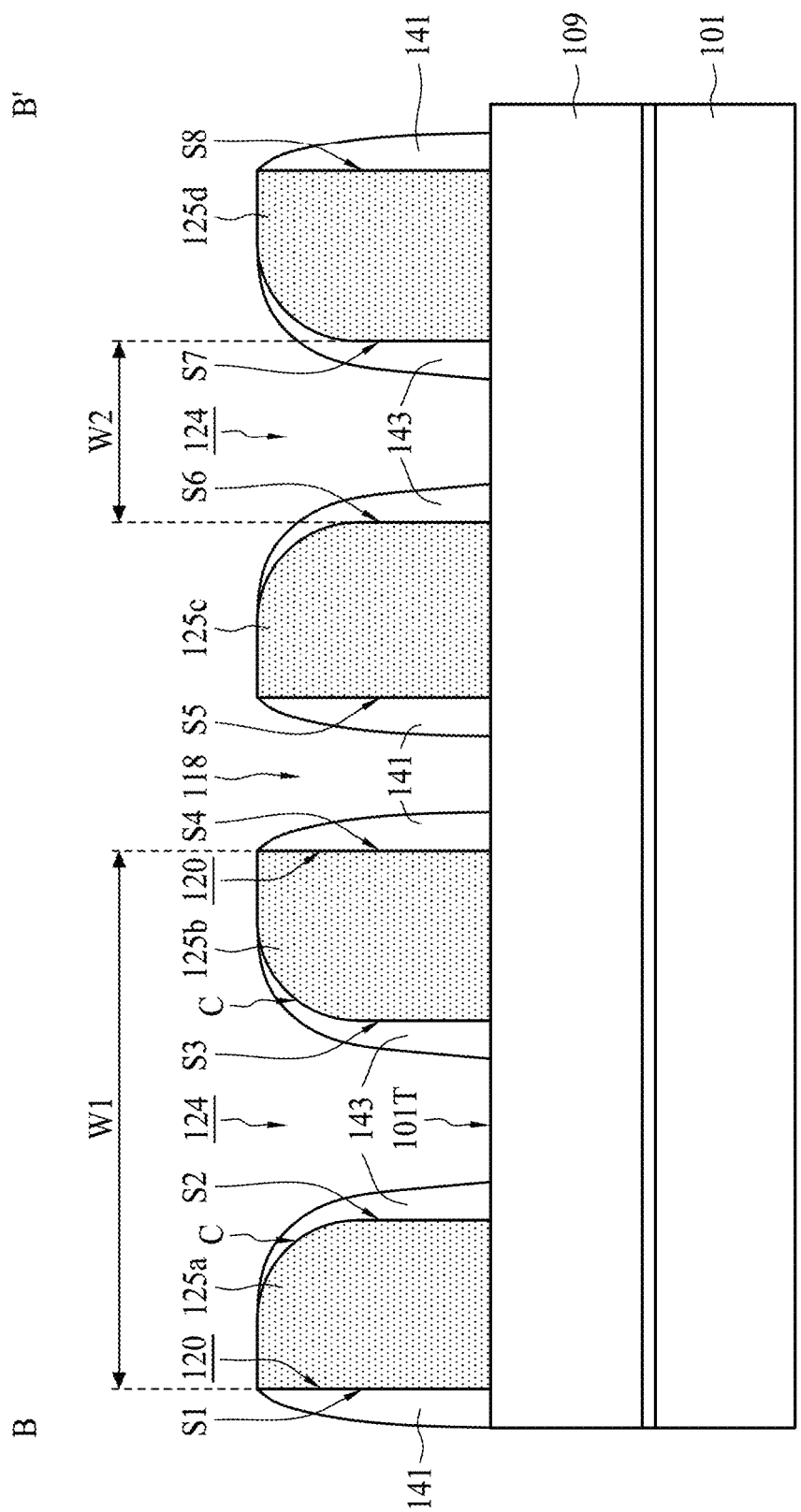
FIG. 13 is a cross-sectional view illustrating one of the intermediate stages in the formation of the semiconductor device along the sectional line B-B' in FIG. 10, in accordance with some embodiments.

FIG. 13 is a cross-sectional view illustrating one of the intermediate stages in the formation of the semiconductor device along the sectional line B-B' in FIG. 10, in accordance with some embodiments. Referring to the step S21 in FIG. 1, the method 10 forms temporary spacers on sidewalls of the spacer bit lines. In some embodiments, after removing the dielectric structure 117 to form the opening 118 between the bit lines 125, temporary spacers 141 and 143 are formed on respective sidewalls of the bit lines 125. In some embodiments, the formation of the temporary spacers 141 and 143 includes forming a spacer layer on the semiconductor substrate 101 and the bit lines 125, covering the top and the sides of the bit lines 125. In some embodiments of the present disclosure, the spacer layer may be silicon oxide or doped silicon oxide. In some embodiments, the spacer layer can be formed by LPCVD with tetraethyl orthosilicate (TEOS), which produces silicon oxide under high temperature. The spacer layer can then be etched to form the temporary spacers 141 and 143. In some embodiments, the etching is an anisotropic etching process such as dry etching with plasma. The anisotropic etching process etches away the horizontal part of the spacer layer on the semiconductor substrate 101 and on the top surface of the bit lines 125, but only partly remove the vertical part of the spacer layer flanking the sidewall of the bit lines 125 so that the remaining spacer layer forms the temporary spacers 141 and 143, as shown in FIG. 11.

Figure 14:
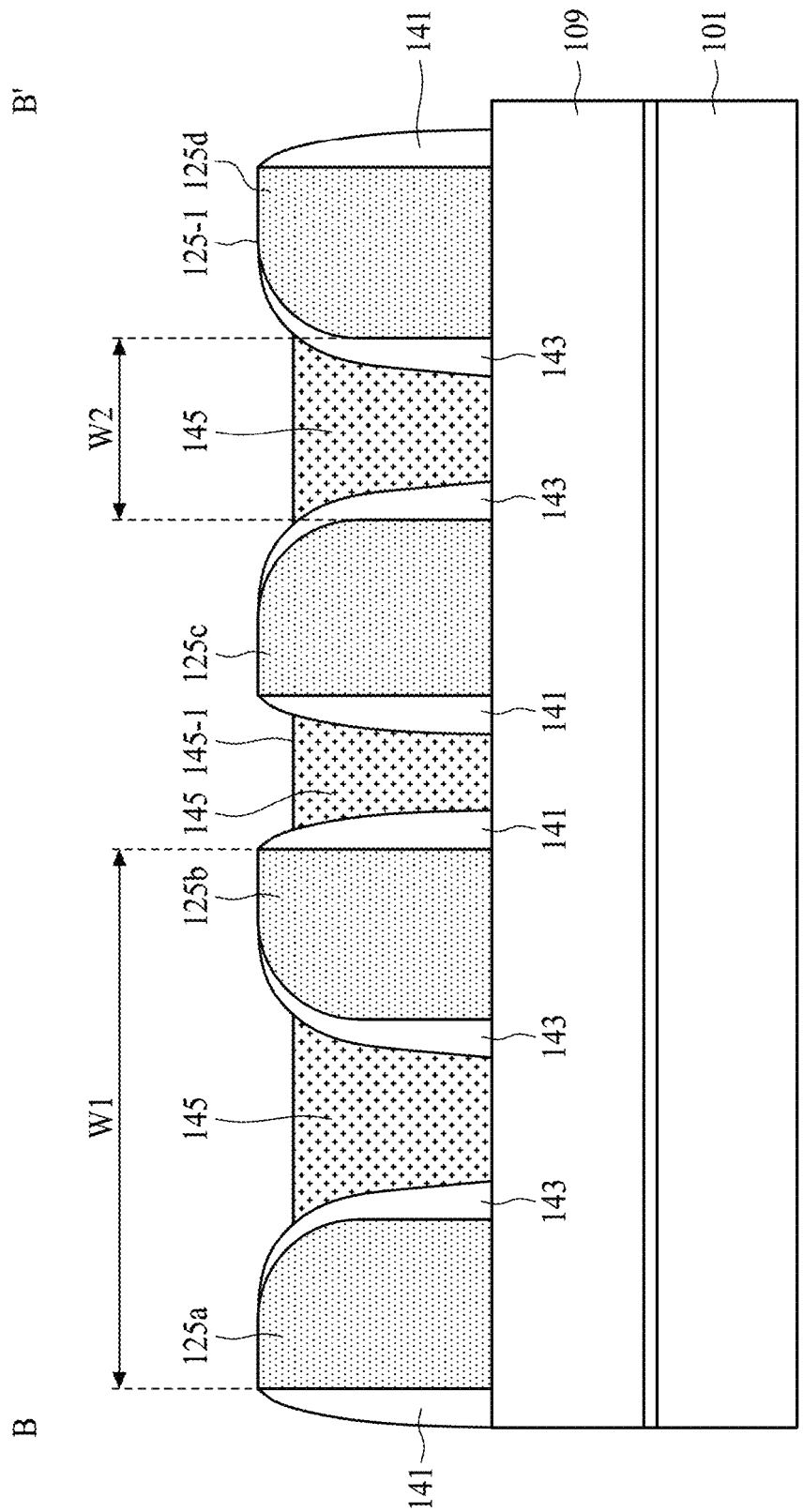
FIG. 14 is a cross-sectional view illustrating one of the intermediate stages in the formation of the semiconductor device along the sectional line B-B' in FIG. 10, in accordance with some embodiments.

FIG. 14 is a cross-sectional view illustrating one of the intermediate stages in the formation of the semiconductor device along the sectional line B-B' in FIG. 10, in accordance with some embodiments. Referring to the step S23 in FIG. 1, the method 10 forms dielectric pillars over the substrate, between the temporary spacers. In some embodiments, after forming the temporary spacers 141 and 143, a plurality of dielectric pillars 145 are formed on the semiconductor substrate 101, between the temporary spacers 141 and 143. In some embodiments, the dielectric pillars 145 are formed by spin coating. In some embodiments, the top end 145-1 of the dielectric pillars 145 is lower than the top end 125-1 of the bit lines 125, and the top portion of the temporary spacers 141 and 143 is exposed.

In some embodiments, the dielectric pillars 145 may be hydrogen silsesquioxane, cyclotene, poly(arylene ether), aerogel of silicon oxide, or xerogel of silicon oxide. In some other embodiments, the dielectric pillars 145 formed by first filling a dielectric material between the temporary spacers 141 and 143 and then dry or cure the dielectric materials to form the dielectric pillars 145. For example, where silica gels are used for forming the dielectric pillars 145, the flowable dielectric material, namely TEOS with solvent, is dispensed on the center of the semiconductor substrate 101 on a spin coater (not shown). The substrate 101 is then rotated at high speed to spread the dielectric material by centrifugal force. Since the dielectric material is flowable, it can easily fill between the spacers. Rotation is continued while the dielectric material spins off the edges of the semiconductor structure 100, until the desired thickness of the dielectric material is achieved. The thickness of the dielectric material can be controlled by the angular speed of the spinning. The thickness also depends on the viscosity and concentration of the dielectric material. In such embodiments, the dielectric material need to be cured to form the dielectric pillars 145. If the dielectric material is dried by evaporation, then the dielectric pillars 145 is silica xerogel; if the dielectric material is dried by supercritical drying, then the dielectric pillars 145 is silica aerogel.

Figure 15:
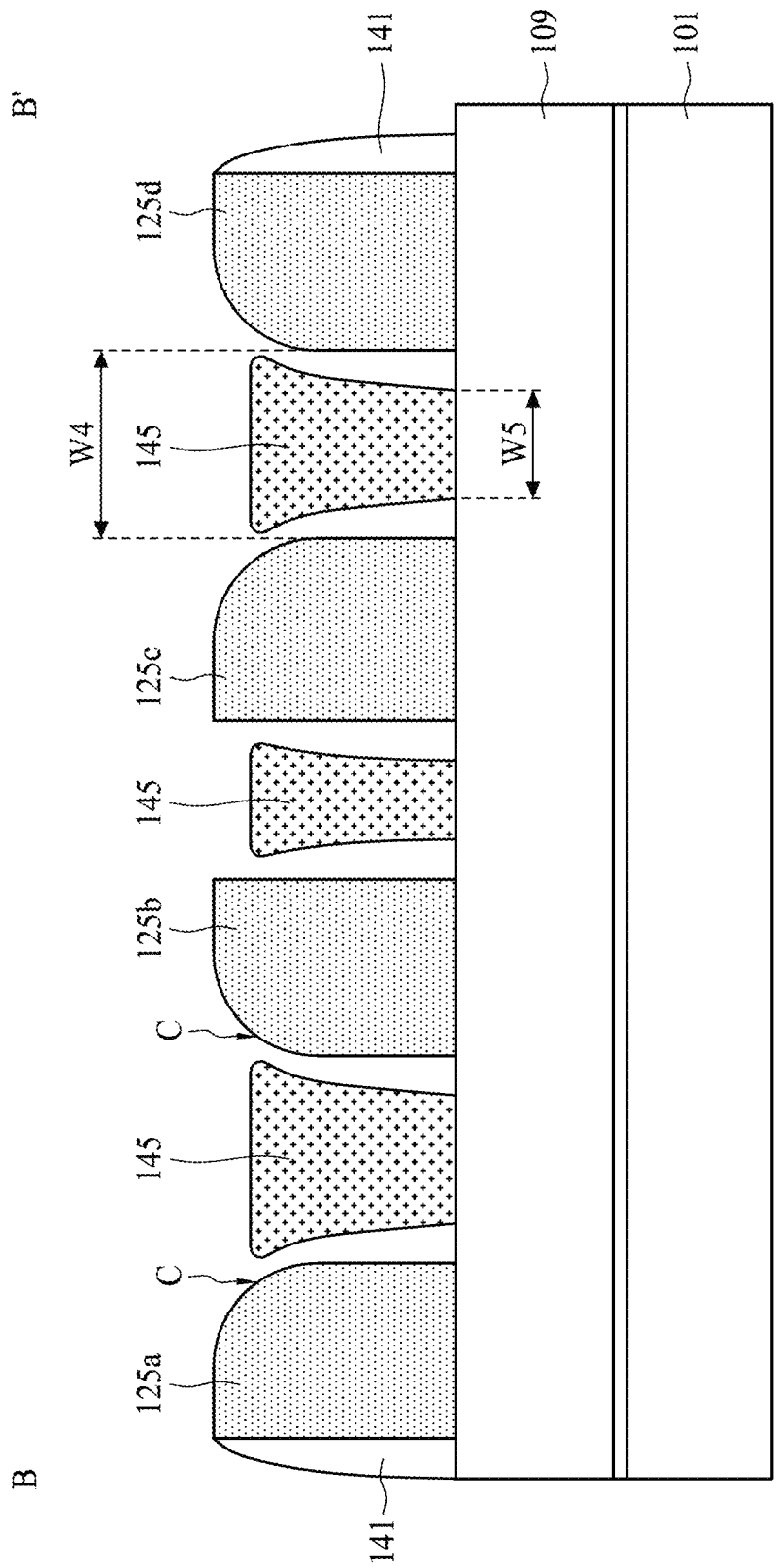
FIG. 15 is a cross-sectional view illustrating one of the intermediate stages in the formation of the semiconductor device along the sectional line B-B' in FIG. 10, in accordance with some embodiments.

FIG. 15 is a cross-sectional view illustrating one of the intermediate stages in the formation of the semiconductor device along the sectional line B-B' in FIG. 10, in accordance with some embodiments. Referring to the step S25 in FIG. 1, the method 10 removes the temporary spacers from the substrate. In some embodiments, after forming the dielectric pillars 145 on the semiconductor substrate 101, the temporary spacers 141 and 143 are removed from the semiconductor substrate 101. In some embodiments, the temporary spacers 141 and 143 can be removed by an etching process. For example the temporary spacers 141 and 143 maybe doped silicon dioxide, and the temporary spacers 141 and 143 can be removed by etching the temporary spacers 141 and 143 with vapor hydrofluoric acid (VHF). Since VHF is highly corrosive to doped silicon dioxide but only mildly etch metal, the use of VHF may effectively remove the temporary spacers 141 and 143 while not damaging the remaining structure on the semiconductor substrate 101 such as the bit lines 125 if, for example, the bit lines 125 is made of metal. In some embodiments, after removing the temporary spacers 141 and 143 by VHF, the dielectric pillars 145 have rounding corners 145-2.

In some embodiments, after removing the temporary spacers 141 and 143, the top width W4 of the dielectric pillar 145 is greater than the bottom width W5 of the dielectric pillar 145. In some embodiments, the top width of the dielectric pillar 145 at one side of the bit lines 125 is different from the top width at another side of the conductive lines 125.

Figure 16:
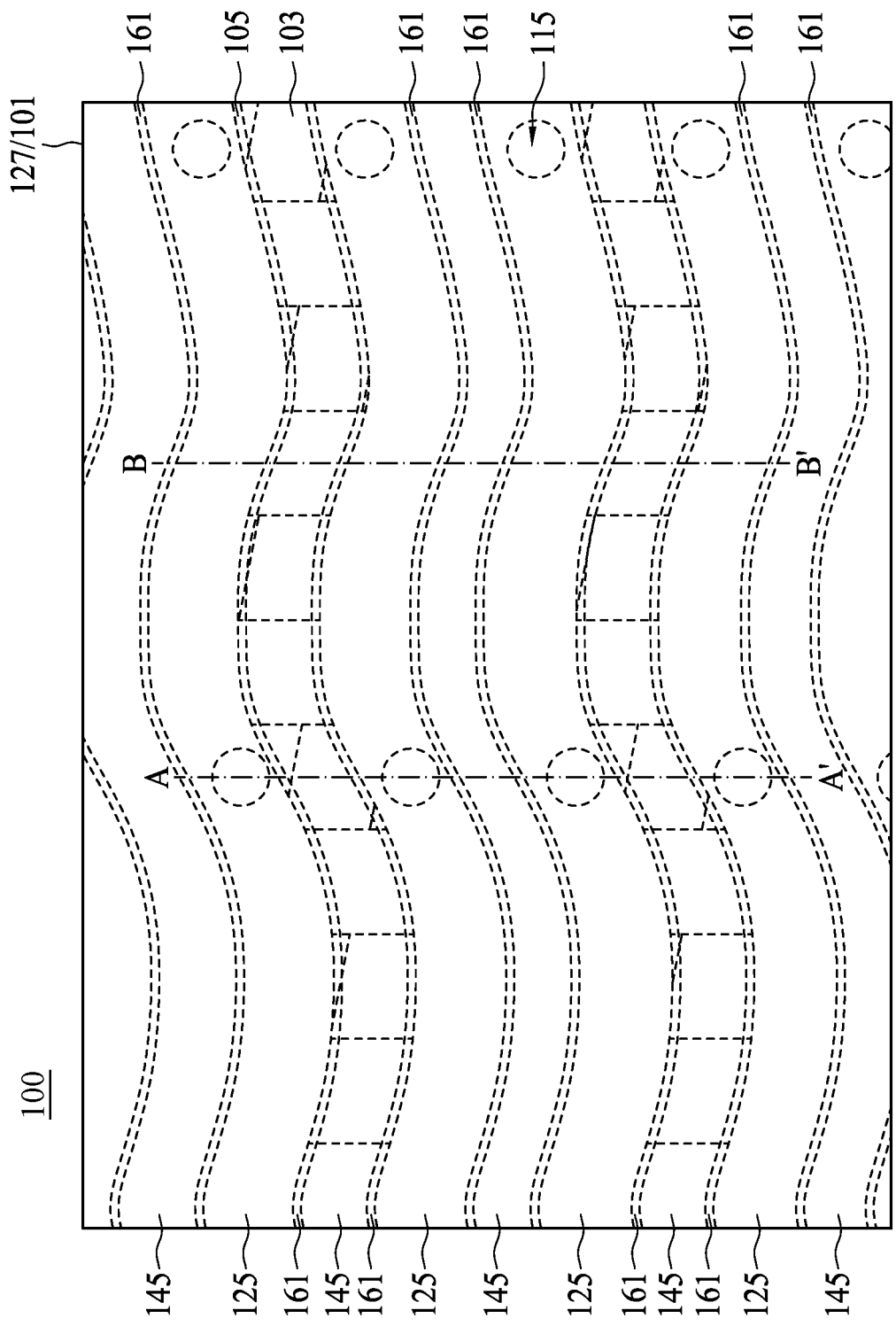
FIG. 16 is a top view illustrating one of the intermediate stages in the formation of a semiconductor device, in accordance with some embodiments.
Figure 17:
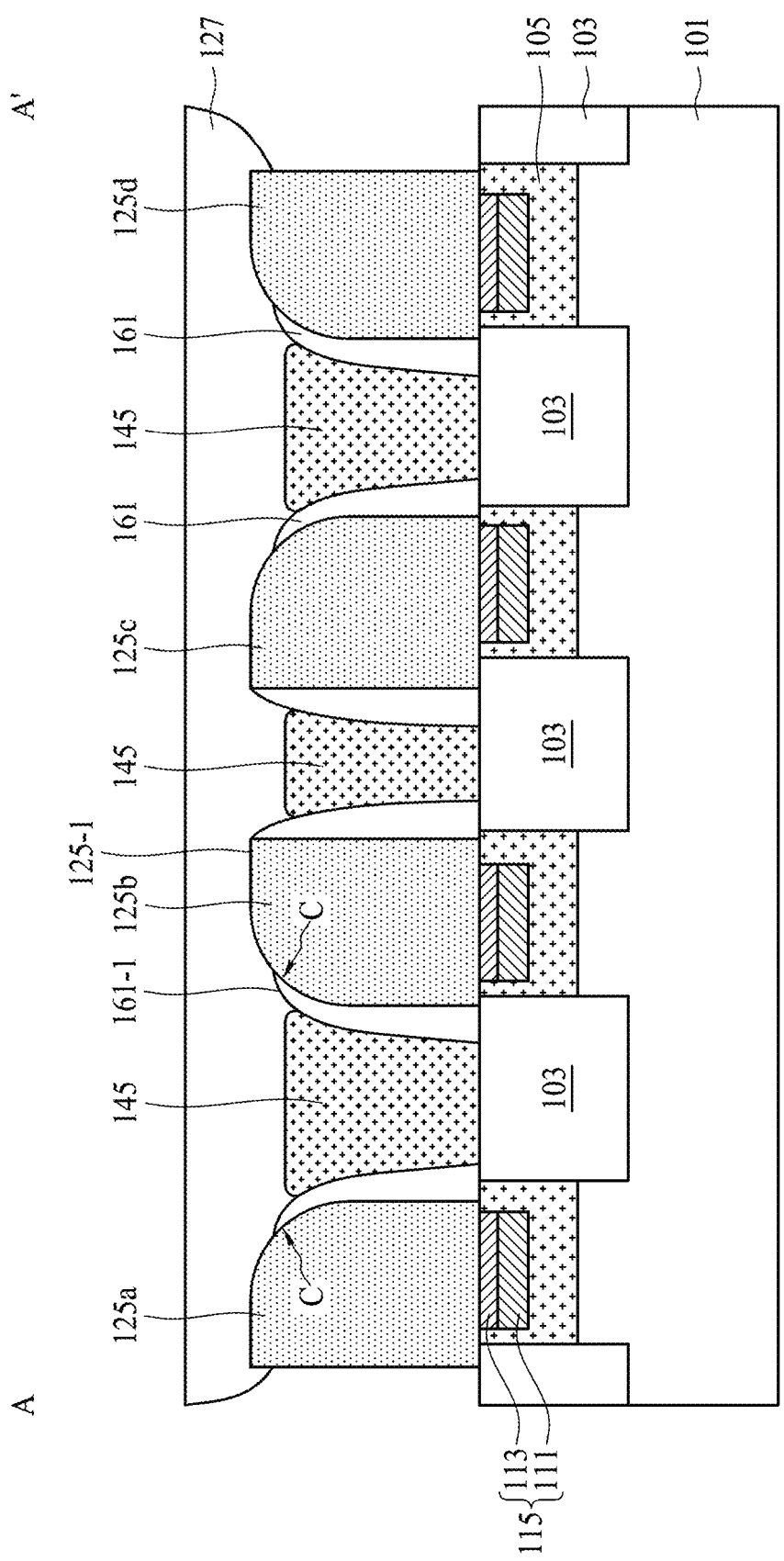
FIG. 17 is a cross-sectional view illustrating one of the intermediate stages in the formation of the semiconductor device along the sectional line A-A' in FIG. 16, in accordance with some embodiments.
Figure 18:
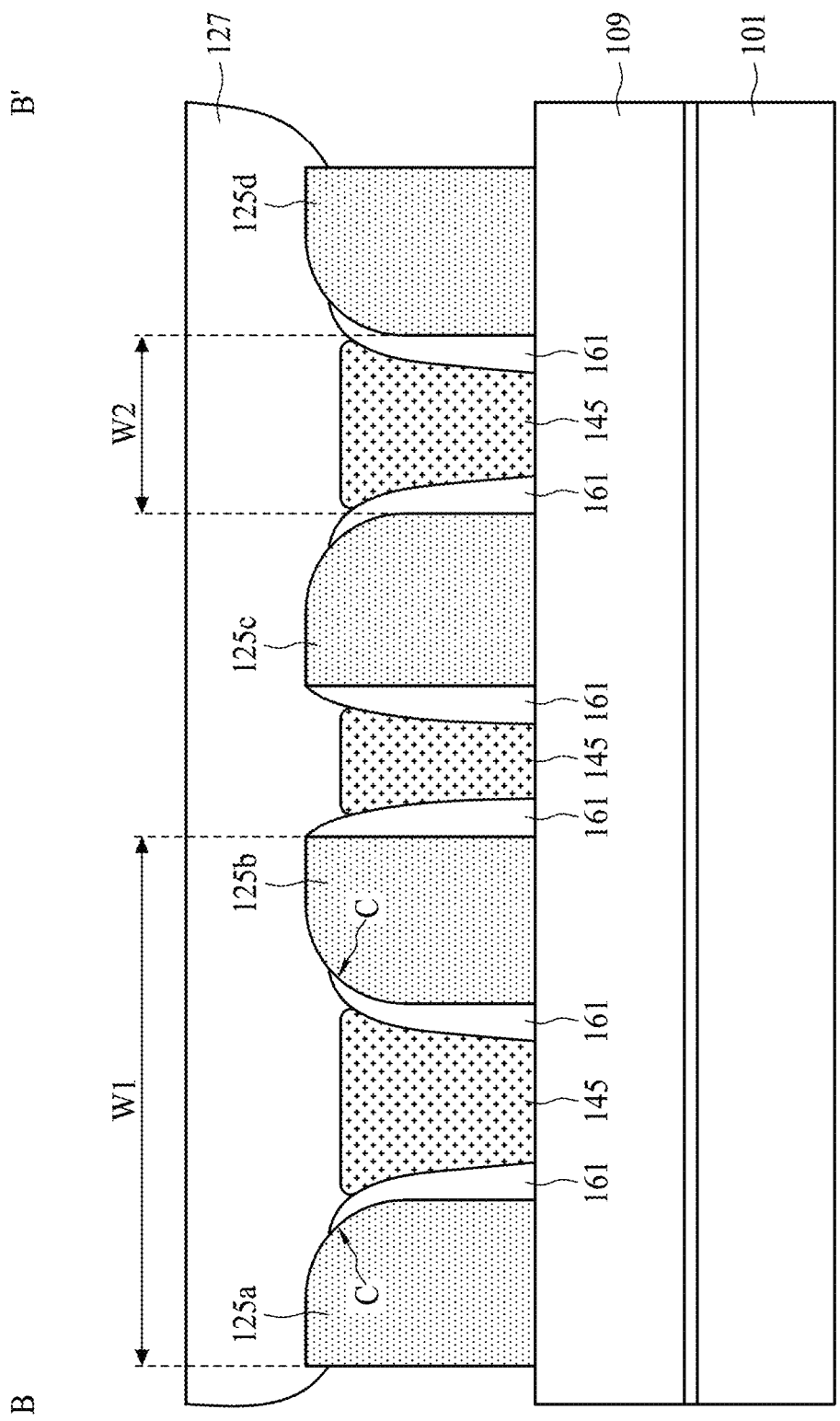
FIG. 18 is a cross-sectional view illustrating one of the intermediate stages in the formation of the semiconductor device along the sectional line B-B' in FIG. 16, in accordance with some embodiments.

FIG. 16 is a top view illustrating one of the intermediate stages in the formation of a semiconductor device, in accordance with some embodiments, FIG. 17 is a cross-sectional view illustrating one of the intermediate stages in the formation of the semiconductor device along the sectional line A-A' in FIG. 16, in accordance with some embodiments, FIG. 18 is a cross-sectional view illustrating one of the intermediate stages in the formation of the semiconductor device along the sectional line B-B' in FIG. 16, in accordance with some embodiments.

Referring to the step S27 in FIG. 1, the method 10 forms a sealing dielectric layer over the spacer bit lines and the dielectric pillars such that air gaps are formed between the sealing dielectric layer and the substrate. In some embodiments, after forming the temporary spacers 141 and 143 on respective sidewalls of the bit lines 125. In some embodiments, after forming dielectric pillars 145 on the semiconductor substrate 101, a sealing dielectric layer 127 is formed over the bit lines 125a, 125b, 125c and 125d such that air gaps 161 are formed between the sealing dielectric layer 127 and the top surface 101T of the semiconductor substrate 101.

In some embodiments, the sealing dielectric layer 127 is made of silicon oxide, silicon nitride, silicon oxynitride, phosphosilicate glass (PSG), borophosphosilicate glass (BPSG), low-k dielectric material, and/or another applicable dielectric material. In some embodiments, the sealing dielectric layer 127 is formed by a chemical vapor deposition (CVD) process, a physical vapor deposition (PVD) process, an atomic layer deposition (ALD) process, a spin-coating process, or another applicable process.

In some embodiments, the sealing dielectric layer 127 is formed by a spin-coating process, and the spaces between the dielectric pillars 145 and the bit lines 125 can be easily sealed by the sealing dielectric layer 127 with the air gaps 161 formed therein rather than entirely filled up by the sealing dielectric layer 127. As a result, the air gaps 161 are enclosed by the sealing dielectric layer 127, the bit lines 125, the dielectric pillars 145, and the top surface 101T of the semiconductor substrate 101 in accordance with some embodiments. In some embodiments, the top surfaces of the bit lines 125 is higher than the top surfaces of the air gaps 161. For example, the top surface 125-1 of the bit line 125 is higher than the top surface 161-1 of the air gaps 161, as shown in FIGS. 17 and 18.

Figure 19:
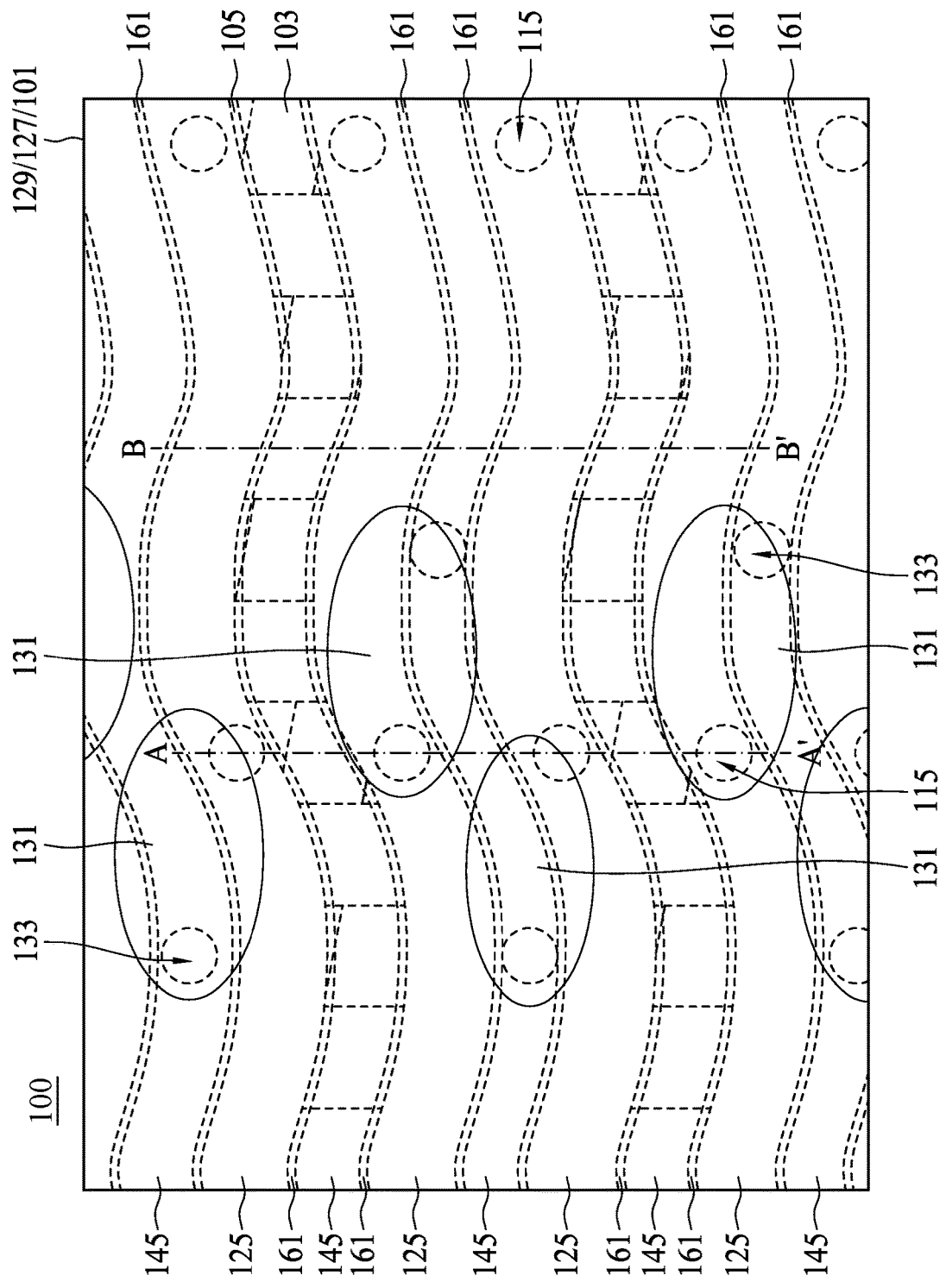
FIG. 19 is a top view illustrating a semiconductor device.
Figure 20:
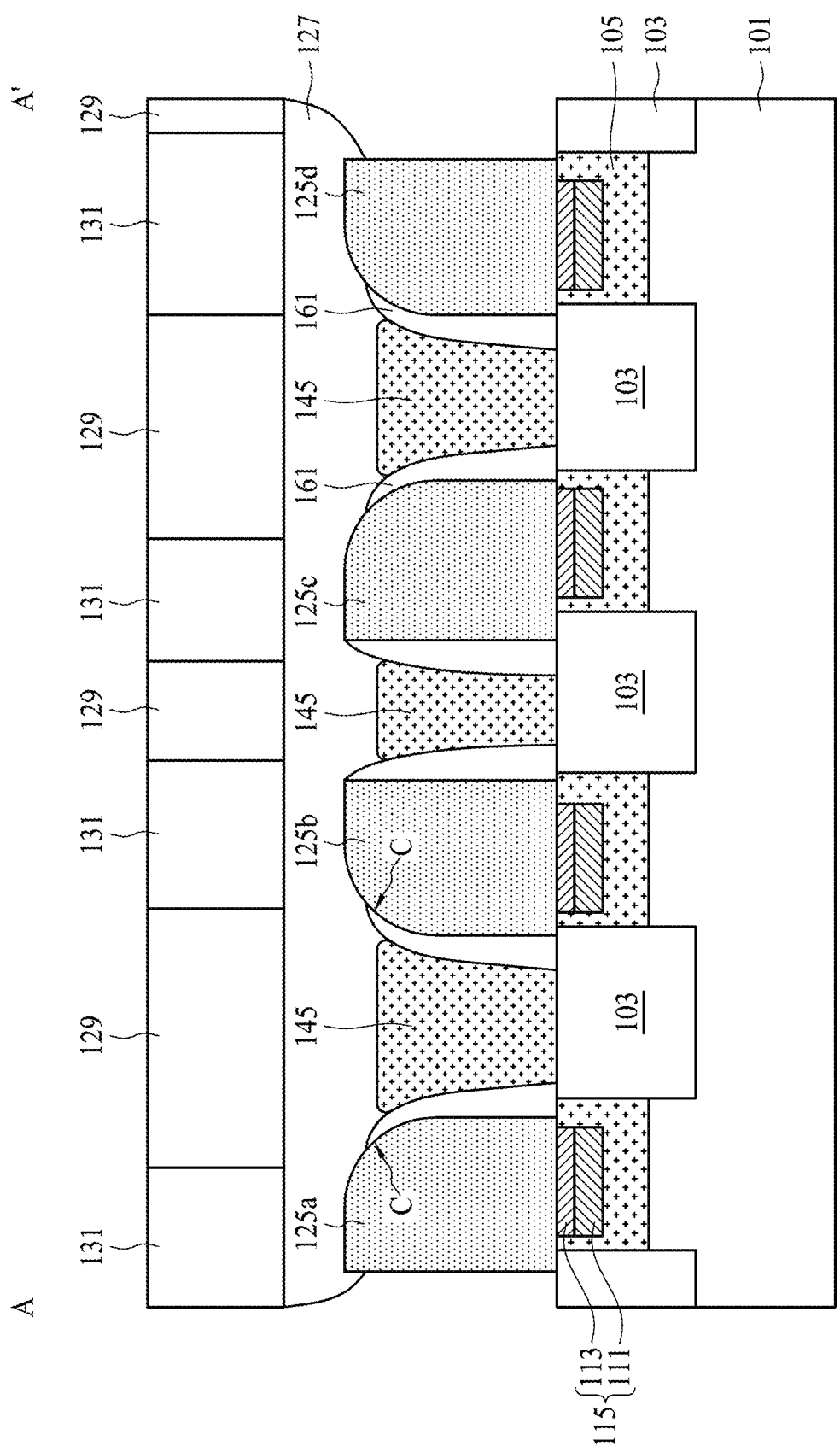
FIG. 20 is a cross-sectional view illustrating the semiconductor device along the sectional line A-A' in FIG. 20, in accordance with some embodiments

FIG. 19 is a top view illustrating a semiconductor device 100, and FIG. 20 is a cross-sectional view illustrating the semiconductor device 100 along the sectional line A-A' in FIG. 19, in accordance with some embodiments. After forming the sealing dielectric layer 127, a planarization process may be selectively performed. In some embodiments, the planarization process includes a grinding process, a chemical mechanical polishing (CMP) process, an etching process, another applicable process, or a combination thereof. Next, an ILD structure 129 is formed over the sealing dielectric layer 127, and capacitors 131 are formed in the ILD structure 129.

Some materials and processes used to form the ILD structure 129 are similar to, or the same as, those used to form the sealing dielectric layer 127, and descriptions thereof are not repeated herein. In some embodiments, the material of the ILD structure 129 is different from the material of the sealing dielectric layer 127 such that the etching selectivity of the ILD structure 129 with respect to the sealing dielectric layer 127 is high during the formation of the capacitors 131. Moreover, the capacitors 131 are made of conductive material, such as poly-crystalline silicon, tungsten (W), copper (Cu), and some processes used to form the capacitors 131 are similar to, or the same as, those used to form the bit line contacts 115, and descriptions thereof are not repeated herein. It should be noted that the capacitors 131 are electrically connected to the active regions 105 in the semiconductor substrate 101 by the capacitor contacts 133. After the capacitors 131 are formed, the semiconductor device 100 is obtained. In the present embodiment, the semiconductor device 100 is a dynamic random access memory (DRAM).

In one embodiment of the present disclosure, a semiconductor device is provided. The semiconductor device includes a plurality of spacer bit lines disposed over a substrate; a plurality of dielectric pillars disposed over the substrate, between the plurality of spacer bit lines; and a sealing dielectric layer disposed over the plurality of spacer bit lines and the plurality of dielectric pillars such that air gaps are formed between the sealing dielectric layer and the substrate.

In one embodiment of the present disclosure, a method for preparing a semiconductor device is provided. The method includes forming a plurality of dielectric structures over a substrate; forming a plurality of spacer bit lines on sidewalls of the plurality of dielectric structures; removing the plurality of dielectric structures from the substrate; forming a plurality of temporary spacers on sidewalls of the spacer bit lines; forming a plurality of dielectric pillars over the substrate, between the plurality of temporary spacers; removing the plurality of temporary spacers from the substrate; and forming a sealing dielectric layer over the plurality of spacer bit lines and the plurality of dielectric pillars such that air gaps are formed between the sealing dielectric layer and the substrate.

Embodiments of a semiconductor device are provided in accordance with some embodiments of the disclosure. The semiconductor device includes spacers bit lines separated by dielectric pillars and air gaps. Therefore, the parasitic capacitance between the spacers bit lines may be reduced by the dielectric pillars and the air gap having low dielectric constant, and the speeds of the semiconductor device may be increased. In addition, the spacers bit lines may be prevented from collapsing due to the structural support provided by the dielectric structure, resulting in an improvement of the overall device performance.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a plurality of spacer bit lines disposed over a substrate;
a plurality of dielectric pillars disposed over the substrate, between the plurality of spacer bit lines; and a sealing dielectric layer disposed over the plurality of spacer bit lines and the plurality of dielectric pillars such that air gaps are formed between the sealing dielectric layer and the substrate.

2. The semiconductor device of claim 1, wherein a top width of the dielectric pillar is greater than a bottom width of the dielectric pillar.

3. The semiconductor device of claim 1, wherein a top surface of the first bit line is higher than a top surface of the air gap.

4. The semiconductor device of claim 1, wherein a bottom width of the dielectric pillar at one side of the spacer bit lines is different from a bottom width at another side of the spacer bit lines.

5. The semiconductor device of claim 1, wherein a top end of the dielectric pillars is lower than a top end of the spacer bit lines.

6. The semiconductor device of claim 1, wherein a top portion of the spacer bit line has a rounded corner.

7. The semiconductor device of claim 6, wherein a portion of the air gap extends between the sealing dielectric layer and the rounded corner of the spacer bit line.

8. The semiconductor device of claim 1, wherein the air gap has a tapered profile.

9. The semiconductor device of claim 1, wherein an upper width of the air gap is less than a bottom width of the air gap.

10. A method for preparing a semiconductor device, comprising:
    forming a plurality of dielectric structures over a substrate;
    forming a plurality of spacer bit lines on sidewalls of the plurality of dielectric structures;
    removing the plurality of dielectric structures from the substrate;
    forming a plurality of temporary spacers on sidewalls of the spacer bit lines;
    forming a plurality of dielectric pillars over the substrate, between the plurality of temporary spacers;
    removing the plurality of temporary spacers from the substrate; and
    forming a sealing dielectric layer over the plurality of spacer bit lines and the plurality of dielectric pillars such that air gaps are formed between the sealing dielectric layer and the substrate.

11. The method for preparing a semiconductor device of claim 10, wherein a top surface of the semiconductor substrate between the spacer bit lines is exposed after forming the plurality of spacer bit lines.

12. The method for preparing a semiconductor device of claim 10, wherein the spacer bit lines are in direct contact with the dielectric structures.

13. The method for preparing a semiconductor device of claim 10, wherein the bit lines are separated by the air gaps and the dielectric pillars.

14. The method for preparing a semiconductor device of claim 10, wherein a top width of the dielectric pillar is greater than a bottom width of the dielectric pillar.

15. The method for preparing a semiconductor device of claim 10, wherein a top surface of the first bit line is higher than a top surface of the air gap.

16. The method for preparing a semiconductor device of claim 10, wherein a bottom width of the dielectric pillar at one side of the spacer bit lines is different from a bottom width at another side of the spacer bit lines.

17. The method for preparing a semiconductor device of claim 10, wherein a top end of the dielectric pillars is lower than a top end of the spacer bit lines.

18. The method for preparing a semiconductor device of claim 10, wherein a top portion of the spacer bit line has a rounded corner.

19. The method for preparing a semiconductor device of claim 10, wherein a portion of the air gap extends between the sealing dielectric layer and the rounded corner of the spacer bit line.

20. The method for preparing a semiconductor device of claim 10, wherein the air gap has a tapered profile, and an upper width of the air gap is less than a bottom width of the air gap.

* * * * *